(12) United States Patent
Gardner et al.

(10) Patent No.: US 12,513,983 B2
(45) Date of Patent: Dec. 30, 2025

(54) 3D ISOLATION OF A SEGMENTATED 3D NANOSHEET CHANNEL REGION

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 694 days.

(21) Appl. No.: 17/892,884

(22) Filed: Aug. 22, 2022

(65) Prior Publication Data

US 2024/0063220 A1 Feb. 22, 2024

(51) Int. Cl.

| | | |
|---|---|---|
| H10D 84/85 | (2025.01) | |
| H01L 21/02 | (2006.01) | |
| H10D 30/01 | (2025.01) | |
| H10D 30/43 | (2025.01) | |
| H10D 30/67 | (2025.01) | |
| H10D 62/10 | (2025.01) | |
| H10D 62/13 | (2025.01) | |
| H10D 84/01 | (2025.01) | |
| H10D 84/03 | (2025.01) | |

(52) U.S. Cl.
CPC ....... *H10D 84/85* (2025.01); *H01L 21/02532* (2013.01); *H01L 21/02603* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 62/151* (2025.01); *H10D 84/0167* (2025.01); *H10D 84/017* (2025.01); *H10D 84/0172* (2025.01); *H10D 84/0188* (2025.01); *H10D 84/038* (2025.01)

(58) Field of Classification Search
CPC . H10D 30/43–435; H10D 62/119–123; H10D 30/014; H10D 30/501–509; H10D 30/6728; H10D 12/032–038; H10D 12/441–491; H10D 30/0291–0297; H10D 30/66–669; H10D 30/63; H10D 84/016; Y10S 977/938; H10K 10/491; H10B 63/34
See application file for complete search history.

(56) References Cited

U.S. PATENT DOCUMENTS

| | | | |
|---|---|---|---|
| 9,024,376 | B2 | 5/2015 | Masuoka et al. |
| 9,425,324 | B2 | 8/2016 | Diaz et al. |
| 9,478,624 | B2 | 10/2016 | Colinge et al. |
| 11,164,942 | B1 * | 11/2021 | Weckx ................. H10D 62/121 |
| 2021/0296315 | A1 * | 9/2021 | Lilak .................. H10D 30/6757 |
| 2021/0407999 | A1 | 12/2021 | Huang et al. |
| 2022/0302275 | A1 | 9/2022 | Yu et al. |

* cited by examiner

*Primary Examiner* — Christine S. Kim
*Assistant Examiner* — Cole Leon Lindsey
(74) *Attorney, Agent, or Firm* — Foley & Lardner LLP

(57) ABSTRACT

Semiconductor devices and corresponding methods of manufacturing the same are disclosed. For example, a plurality of first semiconductor channels vertically spaced from one another and a plurality of second semiconductor channels vertically spaced from one another can be provided. The plurality of first semiconductor channels each have a first sidewall in contact with a dielectric structure and the plurality of second semiconductor channels each have a first sidewall in contact with the dielectric structure. Gate structures can be formed around at least a top surface, a bottom surface, and a second sidewall of the first and second semiconductor channels.

20 Claims, 24 Drawing Sheets

3D ISOLATION OF A SEGMENTATED 3D NANOSHEET CHANNEL REGION

FIELD OF THE DISCLOSURE

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors or channels thereof are stacked on top of each other. 3D integration, i.e., the vertical stacking of multiple devices, aims to overcome scaling limitations experienced in planar devices by increasing transistor density in volume rather than area. Although device stacking has been successfully demonstrated and implemented, various embodiments can include numerous operations, and may include minimum feature distances which limit device density and performance.

SUMMARY

The present disclosure relates to non-planar, or 3D, structures and transistors. The channel regions of the transistors may be oriented to conduct current through the channel in a direction generally parallel with the major surface of the system or chip upon which, or within which, these structures are provided. Multi-channel designs may be utilized to provide cost, performance, and/or design advantages. The techniques and structures described herein provide a higher density of devices using vertically stacked transistors or channels thereof, which allows for a higher 3D density. Further, the vertical self-alignment of transistors pairs can increase density and minimum spacing between one or more vertically stacked transistors of the pair. In certain implementations, a gate replacement operation can be omitted.

One aspect of the present disclosure can be directed to a method. The method can include providing a plurality of first semiconductor channels and a plurality of second semiconductor channels. The first semiconductor channels and the second semiconductor channels can be vertically spaced from one another. The plurality of first semiconductor channels can each have a first sidewall in contact with a dielectric structure. The plurality of second semiconductor channels can each have a first sidewall in contact with the dielectric structure. The method can include forming a first gate structure around at least a top surface, a bottom surface, and a second sidewall of each of the plurality of first semiconductor channels opposite to its respective first sidewall. The method can include forming a second gate structure, concurrently with the first gate structure. The second gate structure can be formed around at least a top surface, a bottom surface, and a second sidewall of each of the plurality of second semiconductor channels opposite to its respective first sidewall.

Forming the first gate structure can include forming a high-k dielectric over at least the top surface, the bottom surface, and the second sidewall of each of the plurality of first semiconductor channels. Forming the first gate structure can include forming a first gate electrode over the high-k dielectric. Forming the second gate structure can include forming the high-k dielectric over at least the top surface, the bottom surface, and the second sidewall of each of the plurality of second semiconductor channels. Forming the second gate structure can include forming a second gate electrode over the high-k dielectric.

Forming the first gate structure or the second gate structure can include forming a gate dielectric over the first semiconductor channels and the second semiconductor channels. Forming the first gate structure or the second gate structure can include forming a gate electrode over the gate dielectric. The gate electrode can include a plurality of horizontal portions vertically bounding the first semiconductor channels and the second semiconductor channels. The gate electrode can include a vertical portion connecting the plurality of horizontal portions. Forming the first gate structure or the second gate structure can include horizontally etching at least the horizontal portions of the gate electrode. The gate electrodes can be horizontally etched by forming openings to access opposite sidewalls of the horizontal portions of the gate electrode. The gate electrodes can be horizontally etched by horizontally etching the opposite sidewalls. Horizontally etching the opposite sidewalls can define a plurality of first source regions disposed on an opposite side of the first semiconductor channels from a plurality of first drain regions. Horizontally etching the opposite sidewalls can define a plurality of second source regions disposed on an opposite side of the second semiconductor channels from a plurality of second drain regions.

The method can include replacing the horizontally etched portion of the gate electrode with an additional dielectric structure.

The method can include doping the first source regions and first drain regions with an n-type dopant. The method can include connecting a metal electrode to the first source regions and the first drain regions.

The plurality of first semiconductor channels can be provided as vertically bounded by a plurality of first sacrificial layers. The first sacrificial layers can be removed prior to forming the first gate structure. The plurality of second semiconductor channels can be provided as vertically bounded by a plurality of second sacrificial layers. The second sacrificial layers can be removed prior to forming the second gate structure.

The sacrificial layers can include a silicon germanium alloy. The first semiconductor channels or the second semiconductor channels can include intrinsic silicon.

The method can include etching openings on opposing sides of each of the plurality of first semiconductor channels and the plurality of second semiconductor channels to access the plurality of first semiconductor channels and the plurality of second semiconductor channels. The method can include doping opposite ends of the plurality of first semiconductor channels and the plurality of second semiconductor channels to form a plurality of activated source/drain regions. The method can include forming a doped semiconductor over the opposite ends of the source/drain regions, to electrically connect thereto.

A contiguous doped semiconductor can be formed over each opposite end of the plurality of first semiconductor channels which connects to each of the plurality of first semiconductor channels.

The plurality of first semiconductor channels can include at least three of the first semiconductor channels. The plurality of second semiconductor channels can include at least three of the second semiconductor channels.

Another aspect of the present disclosure can be directed to a method. The method can include providing a first semiconductor channel and a second semiconductor channel vertically spaced from each other. At least a first dielectric segment, a third semiconductor channel, and a fourth semiconductor channel can be vertically spaced from each other at least with a second dielectric segment. The first semiconductor channel, the second semiconductor channel, and the first dielectric segment can each have a first sidewall in contact with a dielectric structure. The third semiconductor channel, the fourth semiconductor channel, and the second dielectric segment can each have a first sidewall in contact with the dielectric structure. The method can include forming a first gate structure around at least a top surface, a bottom surface, and a second sidewall of the first semiconductor channel opposite to its first sidewall. The method can include forming a second gate structure concurrently with forming the first gate structure. The second gate structure can be formed around at least a top surface, a bottom surface, and a second sidewall of the third semiconductor channel opposite to its first sidewall. The method can include forming a third gate structure around at least a top surface, a bottom surface, and a second sidewall of the second semiconductor channel opposite to its first sidewall. The method can include forming a fourth gate structure concurrently with forming the third gate structure. The fourth gate structure can be formed around at least a top surface, a bottom surface, and a second sidewall of the fourth semiconductor channel opposite to its first sidewall.

Forming the first gate structure can include forming a gate dielectric over the first semiconductor channels and the second semiconductor channels. Forming the first gate structure can include forming a gate electrode over the gate dielectric. The gate electrode can include a plurality of horizontal portions vertically bounding the first semiconductor channels and the second semiconductor channels. The gate electrode can include a vertical portion connecting the plurality of horizontal portions. The method can include horizontally etching at least the horizontal portions of the gate electrode. The horizontal etching can include forming openings to access opposite sidewalls of the horizontal portions of the gate electrode. The horizontal etching can include horizontally etching the opposite sidewalls to define a plurality of source regions disposed on an opposite side of the first and second semiconductor channels from a plurality of drain regions.

The gate dielectric can be a high-k dielectric. The first semiconductor channels can include intrinsic silicon.

A lateral dimension of the first source regions or the first drain regions can be less than the same lateral dimension of the first semiconductor channels.

The method can include etching openings on opposing sides of the first semiconductor channels and the second semiconductor channels to access the first semiconductor channels and the second semiconductor channels. The method can include doping opposite ends of the first semiconductor channels and the second semiconductor channels to form first activated source/drain regions, and second activated source/drain regions. The method can include forming a doped semiconductor over the opposite ends of each of the first semiconductor channels and the second semiconductor channels, to electrically connect thereto.

A contiguous doped semiconductor can be formed over the opposite ends of the first semiconductor channels and the second semiconductor channels which electrically connects to each of the opposite ends of the first semiconductor channels and the second semiconductor channels.

Yet another aspect of the present disclosure can be directed to a structure. The structure can include a dielectric structure vertically extending from a substrate. The structure can include one or more first semiconductor channels extending away from the dielectric structure along a first lateral direction, with a first sidewall of each of the one or more first semiconductor channels in contact with the dielectric structure. The structure can include one or more second semiconductor channels extending away from the dielectric structure along a second, opposite lateral direction, with a first sidewall of each of the one or more second semiconductor channels in contact with the dielectric structure. The structure can include a first gate structure disposed around a top surface, a bottom surface, and a second sidewall of each of the one or more first semiconductor channels. The structure can include a second gate structure disposed around a top surface, a bottom surface, and a second sidewall of each of the one or more second semiconductor channels. The structure can include a pair of first source/drain structures disposed on opposite sides of the first gate structure along a third lateral direction perpendicular to the first and second lateral direction. The structure can include a pair of second source/drain structures disposed on opposite sides of the second gate structure along the third lateral direction.

Lateral extremes can be defined along the third lateral direction and a fourth lateral direction, opposite the third lateral direction, of the first source/drain structures and second source/drain structures of the structure. The first and second source/drain structures can extend beyond corresponding lateral planes of the first gate structures or the second gate structures. The first and second source/drain structures can extend vertically beyond the first and second semiconductor channels. The first and second source/drain structures can comprise an n-type dopant or a p-type dopant.

The structure can include a first isolation material disposed between the substrate and the pair of first source/drain structures. The structure can include an isolation material disposed between the pair of first source/drain structures. The structure can include an additional pair of first source/drain structures, vertically offset from the pair of first source/drain structures.

The first or second gate structures, in combination, can include a high-k dielectric disposed over the first semiconductor channels and the second semiconductor channel. The first or second gate structures, in combination, can include a gate electrode disposed over the high-k dielectric. The gate electrode can include a plurality of horizontal portions vertically bounding the first semiconductor channels and the second semiconductor channels. The gate electrode can include a vertical portion connecting the plurality of horizontal portions. At least the vertical portion of the high-k dielectric can extend beyond lateral extremes of the gate electrode in the third lateral direction, and in a fourth lateral direction, opposite the third lateral direction.

3D integration, e.g., the vertical stacking of multiple devices or channels thereof, aims to overcome scaling limitations experienced in planar devices by increasing transistor density in volume rather than area. Although device stacking has been successfully demonstrated and implemented, various embodiments can include numerous operations, and may include minimum feature distances which limit device density and performance. Improved systems and methods to design devices having improved density, performance, or manufacturability is being pursued.

Techniques herein include methods of forming vertical transistors or transistors having vertically stacked channels regions, source regions, or drain regions. Techniques herein enable a memory or logic device to be formed from vertically stacked nanosheets or other layers. The channels can be a three channel design transistor wherein drive strength of the transistor can be increased or decreased according to forming additional or fewer channels. A channel layer can be substituted for an isolation material, such as a dielectric to form a plurality of isolated transistors. In some embodiments, various portions of the transistors may not be isolated, which can reduce a number of operations. The transistors can be formed having a defined width, wherein the gate electrode is formed, and subsequently etched back to a lesser width to permit the formation of a dielectric layer to isolate the source and drain regions from the gate electrode. The remaining source and drain regions can be connected to a metal electrode or they can be extended, such as by epitaxial growth (and may thereafter be connected to an electrode or other interconnect.)

In some embodiments, a semiconductor device can include a plurality of nanosheet layers to form a first semiconductor-based transistor and a second, vertically aligned semiconductor-based transistor. A number of semiconductor (e.g., silicon) layers can define a number of channels of the transistor. For example, a semiconductor device having three silicon layers can form a transistor having three channel regions for each transistor. In some embodiments, additional semiconductor-based transistors can be formed along a vertical structure of the semiconductor device or may be laterally offset therefrom. In some embodiments, additional semiconductor layers can define additional channel regions of the transistors, or additional transistors. For example, a semiconductor device having six silicon layers can form one transistor pair having six channel regions, six transistors having one channel region, two transistor pairs having one channel region, and a transistor pair having two regions, and so on. For example, transistors can include a complementary field effect transistor (CFET) pair, or a memory device can be formed. Various operations or components of the various embodiments can be substituted, omitted, added, or modified. For example, transistors types can be varied according to a desired application (e.g., p-type or n-type).

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
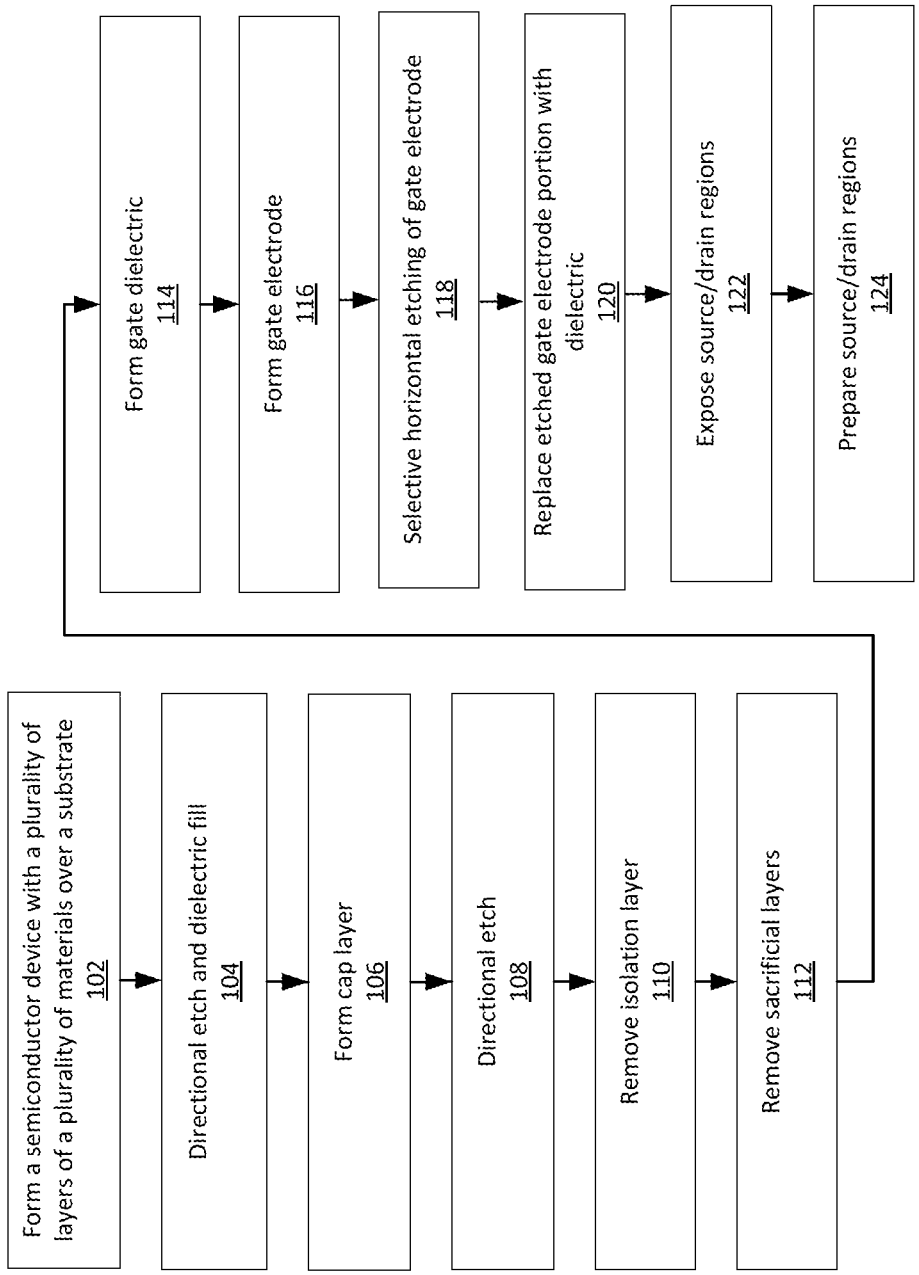
FIG. 1 is a flow chart of a method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more vertical transistor structures having one or more nanostructures formed from nanosheets. The nanostructures can include semiconductor channels such as silicon layers. In some embodiments, silicon germanium sacrificial layers are disposed between the semiconductor channels. Based on a scalable architecture of such semiconductor channels, advantageously, the vertical transistor structures, as disclosed herein, may be scaled in performance or quantity. In some aspects, any number of the vertical transistor structures can be laterally (e.g., side-by-side) arranged with each other and vertically stacked on top of one another, thereby forming an array of vertical transistor structures having improved characteristics in an area efficient manner. For example, the array can include pairs of transistors having a reduce spacing dimension therebetween compared to at least some other transistor to transistor spacing dimensions.

Reference will now be made to the figures, which for the convenience of visualizing the 3D fabrication techniques described herein, illustrate a substrate undergoing a process flow. Unless expressly indicated otherwise, each figure represents one (or a set) of fabrication steps in a process flow for manufacturing the devices described herein. In the Figures, connections between conductive layers or materials may be shown. However, it should be understood that these connections between various layers and masks are merely illustrative, and are intended to show a capability for providing such connections and should not be considered limiting to the scope of the claims.

Likewise, although the figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a rectangular configuration, other shapes are also contemplated, and indeed the techniques described herein may be implemented in any shape or geometry.

FIG. 1 illustrates a flow chart of a method 100 for making a transistor pair, based on a vertical stack structure. For example, the vertical stack structure can be formed by a plurality of nanosheets to form a semiconductor device. The vertical stack structure can include two transistors and an electrical connection therebetween. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor device (also referred to herein as a structure) at various fabrication stages as shown in FIGS. 2 to 17, which will be discussed in further detail below. It should be understood that the semiconductor device, shown in FIGS. 2 to 17, may include a number of other devices such as inductors, fuses, capacitors, coils, etc., while remaining within the scope of the present disclosure.

In brief overview, the method 100 starts with operation 102 of forming a semiconductor device comprising a plurality of materials formed over a substrate. The method 100 continues to operation 104 of directionally etching a portion of the semiconductor device, and filling the etched portion with a dielectric fill. The method 100 proceeds to operation 106 of forming a cap layer over the semiconductor device. The method 100 proceeds to operation 108 of directionally etching first openings into the semiconductor device. The method proceeds to operation 110 of isolating a portion of the semiconductor device from the substrate. The method 100 proceeds to operation 112 of removing a sacrificial material. The method 100 proceeds to operation 114 of forming a gate dielectric over the semiconductor layers. The method 100 proceeds to operation 116 wherein a metal gate electrode is formed over the gate dielectric. At operation 118, horizontal portions of the gate electrode are selectively horizontally etched. At operation 120, the horizontally etched portions of the gate electrode are replaced with a dielectric. At operation 122, the source/drain regions are exposed. At operation 124, the source/drain regions are prepared for connection such as by doping or a connection of metal electrodes.

Figure 2:
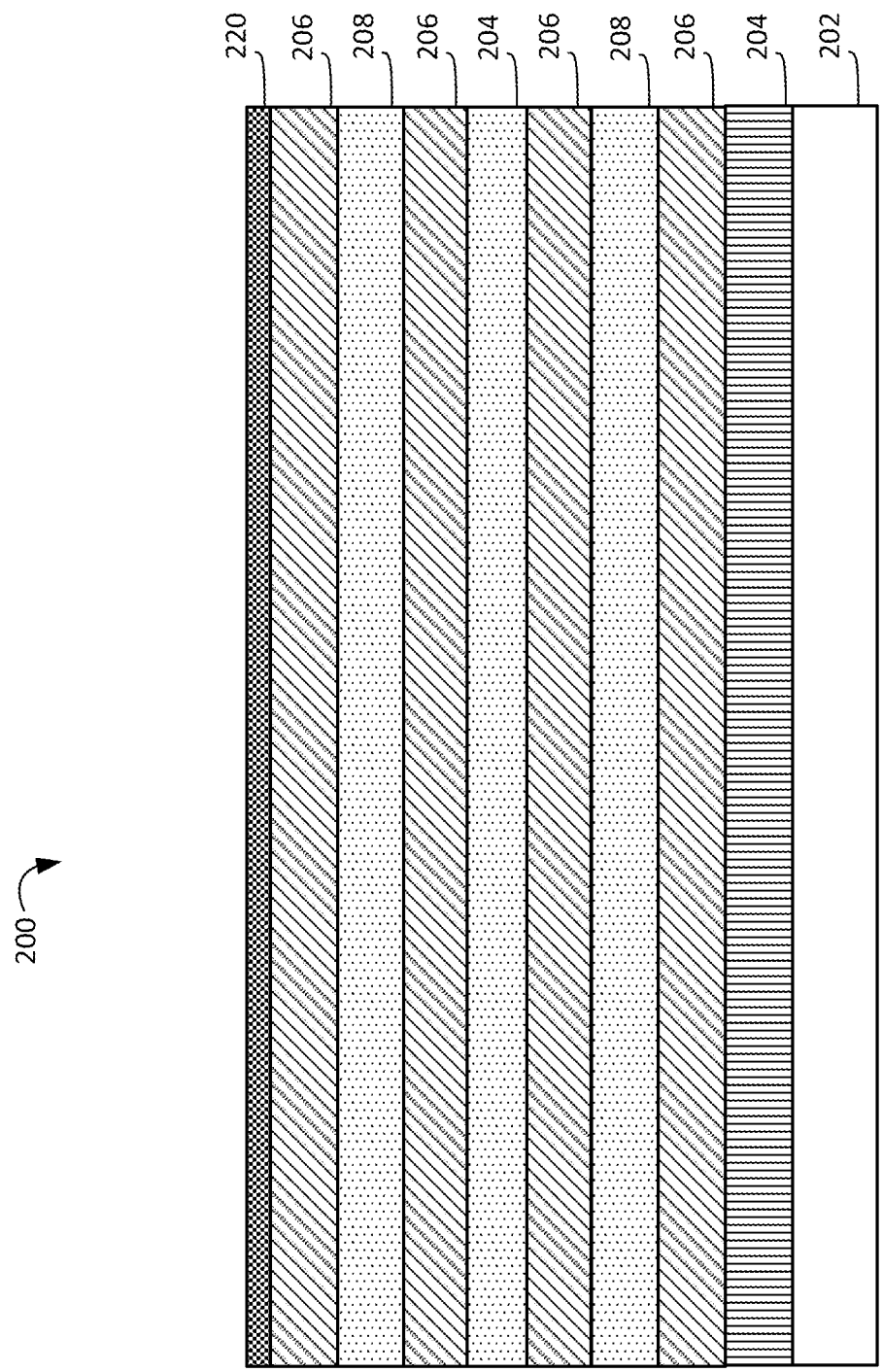
FIG. 2 illustrates a cross sectional view of a semiconductor device during various fabrication stages, made by the method of FIG. 1, in accordance with some embodiments.

Corresponding to operation 102 of FIG. 1, FIG. 2 is a cross sectional view of a semiconductor device 200 in which a plurality of layers (e.g., blanket layers), including a plurality of materials, are formed over a substrate 202 (e.g., a crystalline silicon, a glass substrate, etc.), in accordance with various embodiments.

As shown in FIG. 2, a first layer 204 can be formed over the substrate 202. The first layer 204 and the various additional dielectric and conductive layers and materials herein can be placed, grown, (e.g., epitaxially with or without a seed layer), or otherwise formed to create layers of the semiconductor device 200. The formation of the various layers of the semiconductor device 200 can include planarization of the layers, such as by cutting, ablation, chemical mechanical grinding or polishing (CMG/P), or other planarization techniques. The first layer 204 can be or include a material which can be selectively etched, relative to one or more adjacent materials, such as the substrate 202 and a second layer 206. For example, the first layer 204 can be formed from silicon-germanium of a first molar ratio, the substrate 202 can be formed from crystalline silicon, and the second layer 206 can be formed from silicon-germanium of a second molar ratio, which is referred to herein as SiGe. Thus, the first layer 204 can be an epitaxially grown sacrificial nanosheet layer which can be selectively removed without removing one or more adjoining layers.

The second layer 206 is formed over the first layer 204. The second layer 206 can include a different material than the first material. For example, the second layer 206 can be an epitaxially grown SiGe layer, as discussed above. A third layer 208 can be formed over the second layer 206. The third layer 208 can be or include a semiconductor material such as silicon (e.g., intrinsic silicon), which may be epitaxially grown over the second layer 206. A further second layer 206 can be formed (e.g., epitaxially grown) over the third layer 208. The further second layer 206 can be or include a dielectric or semiconductor which can be selectively etched relative to the semiconductor material of the third layer 208. For example, the further second layer 206 can be SiGe (e.g., may be the same mole ratio of silicon-germanium as the second layer 206). The further third layer 208 can be a semiconductor material. For example, the further third layer 208 can be the same semiconductor material as the third layer 208.

A further third layer 206 can be or include a dielectric or semiconductor which can be selectively etched relative to the semiconductor material of the further third layer 208. For example, the further third layer 208 can be silicon-germanium which may be epitaxially grown over the further third layer 208 (e.g., may be the same mole ratio of silicon-germanium as the second layers 206). An upper third layer 206 can be formed over the further third layer 208. The upper third layer 206 can be a semiconductor material. For example, the upper third layer 206 can be the same semiconductor material as the third layers 208. The third layers 208 can be formed as a doped semiconductor (e.g., epitaxially grown with a dopant or dopant precursor), or formed and thereafter doped such as by diffusion or ion implantation. For example, at least one layer can be an n-type semiconductor or at least one layer can be a p-type semiconductor. As discussed above, in some embodiments the semiconductor layers can be intrinsic semiconductor such as intrinsic silicon. An upper second layer 206 can be formed over the upper third layer 206. The upper second layer 206 can be or include a dielectric or semiconductor which can be selectively etched relative to the semiconductor material of the upper third layer 206. For example, the upper second layer 206 can be the same material as any of the second layers 206. A cap layer 220 of the semiconductor device 200 can be formed (e.g., deposited) over the upper second layer 206. The cap layer 220 can be a cap layer, such as a protectant from environmental or processing operations (e.g., the methods disclosed herein). For example, the cap layer 220 can be a hard mask. In some embodiments, additional or fewer sacrificial or semiconductor nanosheets can be formed. For example, although the transistors of the various embodiments disclosed herein are disclosed as tri-gate transistors (e.g., comprising three source/drain layers), transistors may be formed of additional or fewer source/drain layers (e.g., dual-gate transistors or quad-gate transistors). The tri-gate transistors are sometimes referred to as nano-fork or fork-sheet devices.

In some embodiments, additional or fewer layers can be included in the semiconductor device. For example, additional instances semiconductor layers disposed between sacrificial layers (e.g., similar to the third layer 208) can be inserted in the device to form a fourth source/drain portion, a fifth source/drain source region, and so on.

Figure 3:
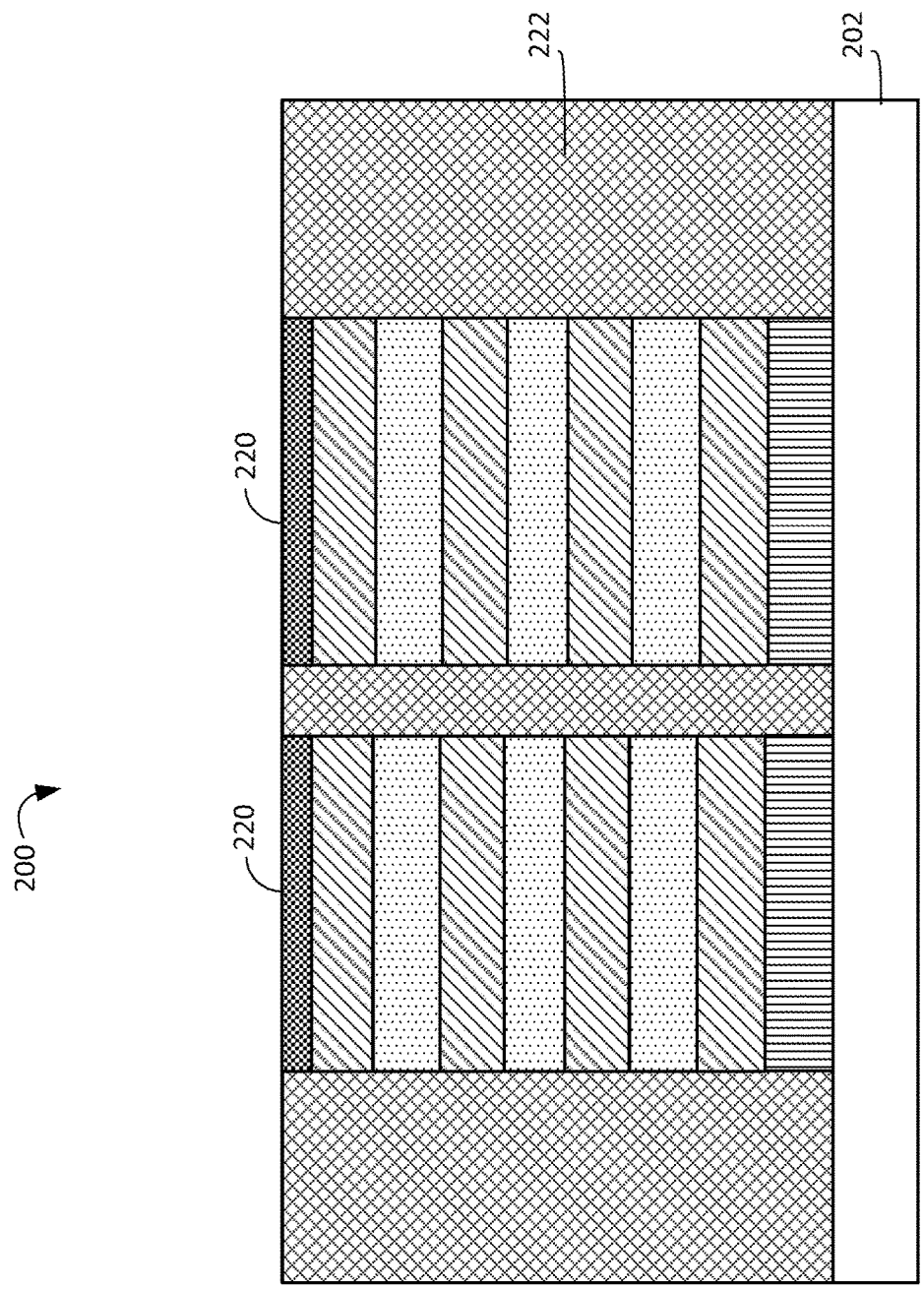
FIG. 3 illustrates a cross sectional view of a semiconductor device during various fabrication stages, made by the method of FIG. 1, in accordance with some embodiments.

Corresponding to operation 104 of FIG. 1, FIG. 3 is a cross sectional view of the semiconductor device 200 in which the layers of the respective nanosheets are directionally etched and replaced with a dielectric, in accordance with various embodiments. A mask (not depicted) defines a first portion of the semiconductor device 200 for etching, and a second portion of the semiconductor device 200 to remain. The remaining portions of each nanosheet of the semiconductor device 200 can be referred to herein as nanostructures. To etch the first portion, a first patternable layer (e.g., a photoresist material) can be formed over the surface of the semiconductor device 200. The layers of the semiconductor device 200 can be etched to a depth of the substrate 202. For example, the etchant can be timed to etch to the substrate 202, the substrate 202 can be non-reactive with the etchant, or an etch stop layer can be disposed along a surface of the substrate 202. The etching process may be anisotropic and/or isotropic. The photoresist material can be stripped from the semiconductor device 200, and a body dielectric 222 (also referred to herein as a dielectric structure) can be formed in an etched area. For example, the body dielectric 222 can be formed by a deposition process (e.g., CVD), or another fill process and any dielectric disposed over at a level above the cap layer 220 (e.g., the hard mask) can be removed by a planarization process such as CMG/P. The etching can leave vertical structures (e.g., columns or transistor core stacks) of the plurality of nanostructures. For example, a plurality of vertical structures can be formed at regular interval to form a device wherein at least one transistor pair is formed from each of the depicted nanostructures.

Figure 4:
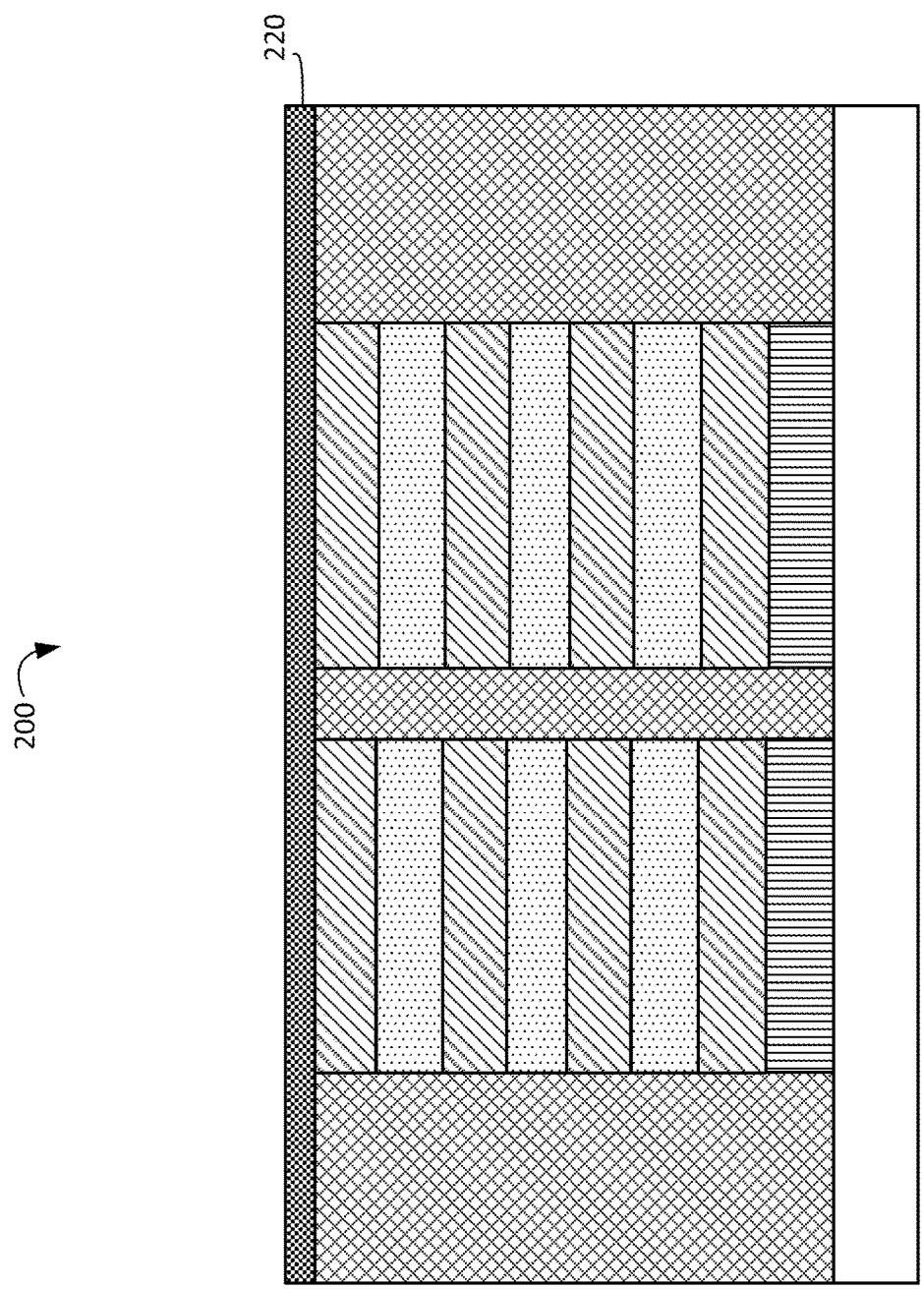
FIG. 4 illustrates a cross sectional view of a semiconductor device during various fabrication stages, made by the method of FIG. 1, in accordance with some embodiments.

Corresponding to operation 106 of FIG. 1, FIG. 4 is a cross sectional view of the semiconductor device 200 in which a cap layer is formed or augmented over a surface of the semiconductor device 200, in accordance with various embodiments. As shown in FIG. 4, the cap layer of the cap layer 220 can have a planar surface. For example, the cap layer of the cap layer 220 can be formed by depositing material, and thereafter planarizing a surface thereof. For example, the material can be grown or deposited by a CVD process and thereafter a CMD/G process can plane the upper surface of the cap layer 220. The cap layer of the cap layer 220 can be formed (e.g., grown, deposited, or otherwise provided) to include silicon carbide, titanium nitride, or other layers which may resist an oxidation, can be formed by oxidation such as silicon dioxide, or can include a material to resist one or more etchants, (e.g., can be a hard mask such as a silicon carbide hard mask, or a titanium nitride hard mask).

The cap layer 220 of FIG. 4 is referred to similarly as the cap layer 220 of FIG. 1. Such a nomenclature is not intended to be limiting. In various embodiments, the composition, or dimension of the cap layer formed at operation 106 can vary from the cap layer formed at operation 102. For example, the cap layer can be thicker or thinner, or comprise different components or different ratios thereof. The cap layer formed at operation 106 can comprise portions of the cap layer formed at operation 102 and additional portions to augment the protection of the cap layer. For example, forming the cap layer at operation 106 can be or include replacing the etched portions (e.g., at operation 104) or can augment the cap layer with an additional material to protect the semiconductor device 200 from further processing operations. In some embodiments, the cap layer of FIG. 1 can be removed (e.g., by a CMD/G process) to form the cap layer 220 of FIG. 4.

Figure 5:
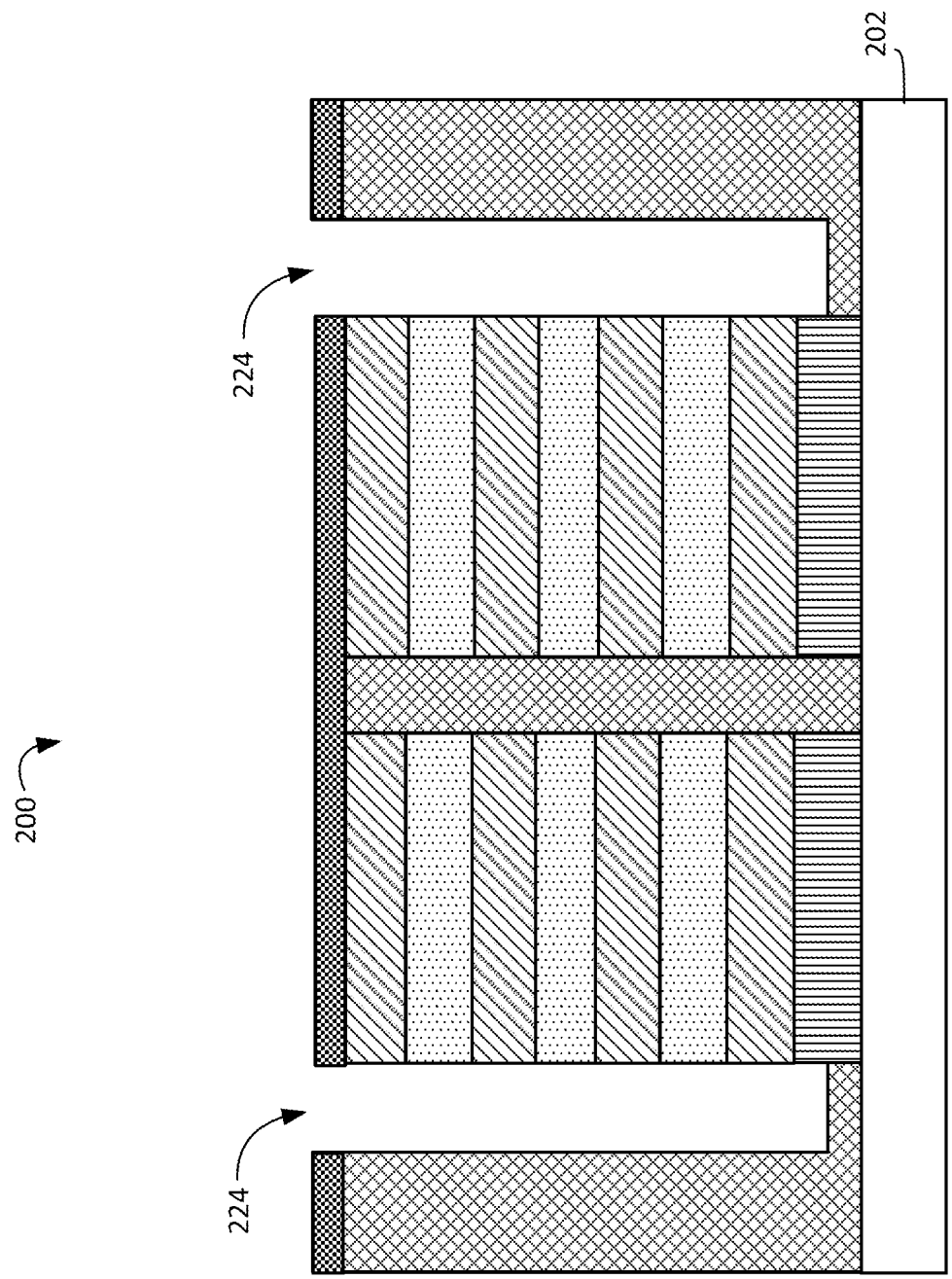
FIG. 5 illustrates a cross sectional view of a semiconductor device during various fabrication stages, made by the method of FIG. 1, in accordance with some embodiments.

Corresponding to operation 108 of FIG. 1, FIG. 5 is a cross sectional view of the semiconductor device 200 in which first openings 224 are formed, in accordance with various embodiments. As shown in FIG. 5, the first openings 224 are formed in the semiconductor device 200 by directionally etching the surface of the semiconductor device 200 toward the substrate 202. For example, a mask (not depicted) can define the openings, and the openings can thereafter be formed according to a similar operation as operation 104. The first openings 224 can be disposed along one or more layers of the semiconductor device 200. The first openings 224 can expose the substrate 202 as viewed from the top of the device (e.g., as depicted in FIG. 4A). In some embodiments the, the first openings 224 can extend to or about to the substrate. For example, the first openings 224 can extend at least to the upper surface of the first layer 204 of the semiconductor device, which may ease an egress of the etched first material from the first openings 224, as is described with reference to operation 110.

Figure 6:
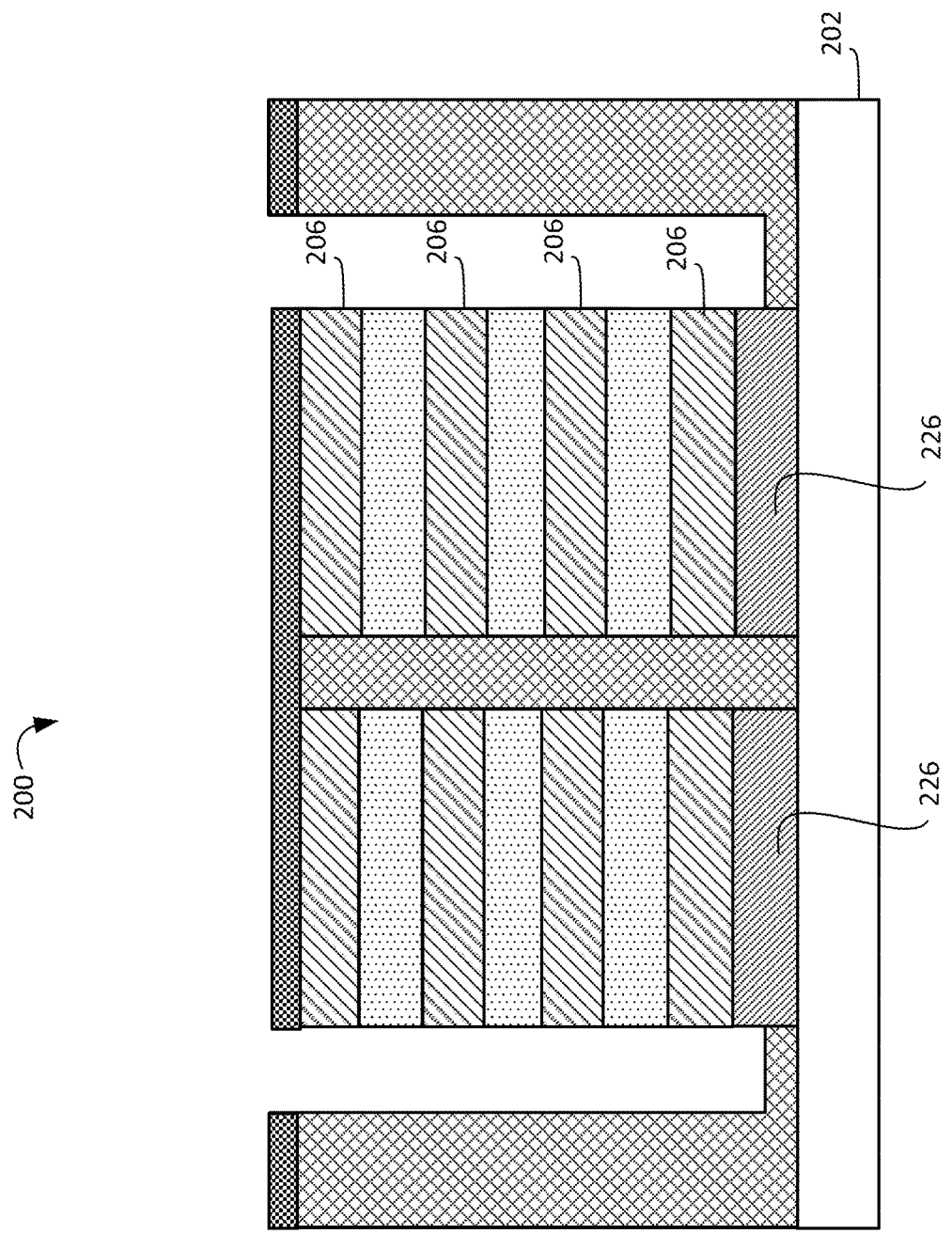
FIG. 6 illustrates a cross sectional view of a semiconductor device during various fabrication stages, made by the method of FIG. 1, in accordance with some embodiments.

Corresponding to operation 110 of FIG. 1, FIG. 6 is a cross sectional view of the semiconductor device 200 in which one or more semiconductor segments of the semiconductor device 200 are isolated from the substrate 202, in accordance with various embodiments. As shown in FIG. 6, a bottommost layer (e.g., the first layer 204) of the semiconductor device 200 is selectively removed. For example, the first layer 204 can be a dielectric or a silicon-germanium material of different mole fraction than the second layer 206 or other layers of the semiconductor device 200. An etchant can be introduced to the semiconductor device 200 via the first openings 224, and the etchant can thereby access and etch the first layer 204 of the semiconductor device 200. The removal of the first layer 204 can isolate additional layers of the semiconductor device 200 from the substrate 202. For example, the etchant can be stripped from the semiconductor device 200 to form an air gap between the substrate 202 and the second layer 206 of the semiconductor device 200.

In some embodiments, an isolation material 226 can be formed in the recess formed by the evacuation of the material of the first layer 204. For example, the isolation material can be a polymer or other dielectric material or semiconductor material, a nano-plane isolating layer, or another isolation material 226. In some embodiments, the isolation material 226 can resist a same etchant or other etchant such as a related etchant used to remove the first layer 204. For example, the isolation material 226 can be resistant to an etchant used to remove additional layers of the semiconductor device (e.g., sacrificial material of the second layers 206), as will be further described with reference to FIG. 7.

Figure 7:
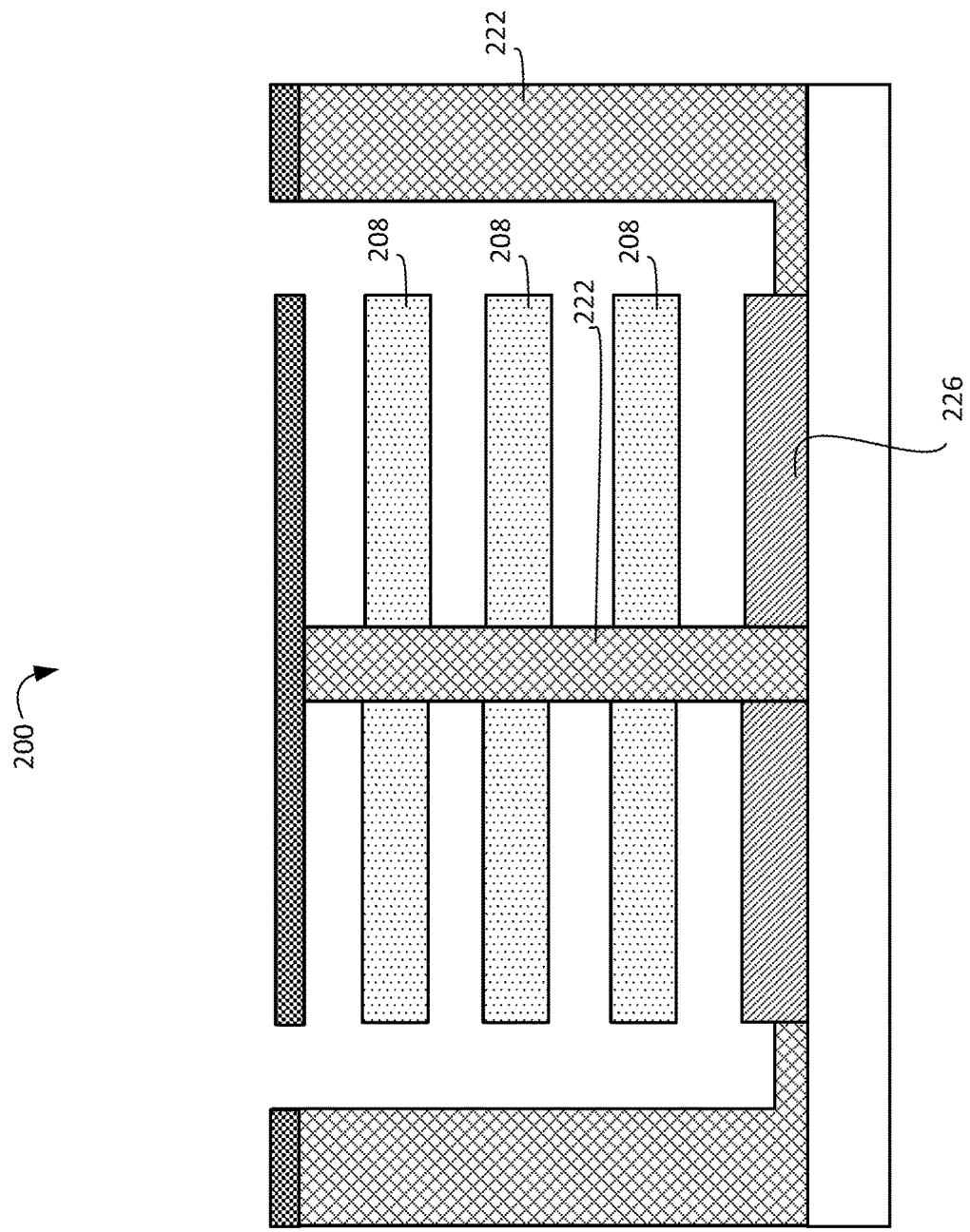
FIG. 7 illustrates a cross sectional view of a semiconductor device during various fabrication stages, made by the method of FIG. 1, in accordance with some embodiments.

Corresponding to operation 112 of FIG. 1, FIG. 7 is a cross sectional view of the semiconductor device 200 in which additional sacrificial layers are removed from the semiconductor device 200, in accordance with various embodiments. As shown in FIG. 7, the additional dielectric layers can be etched and removed in similar fashion to the first layer 204. For example, an etchant can be introduced through the first openings to remove sacrificial layers disposed vertically adjacent to the remaining semiconductor materials. As depicted in FIG. 7, the second layers 206 are removed.

The etchant can selectively etch the sacrificial layer, relative to the body dielectric 222, the remaining semiconductor layers (e.g., the third layers 208), and the isolation material 226. The selectivity can be based on the material properties of a bulk material or can be based on one or more intermediate layers (e.g., oxidation layers or etch stop layers) formed over the various layers and materials thereof.

Figure 8:
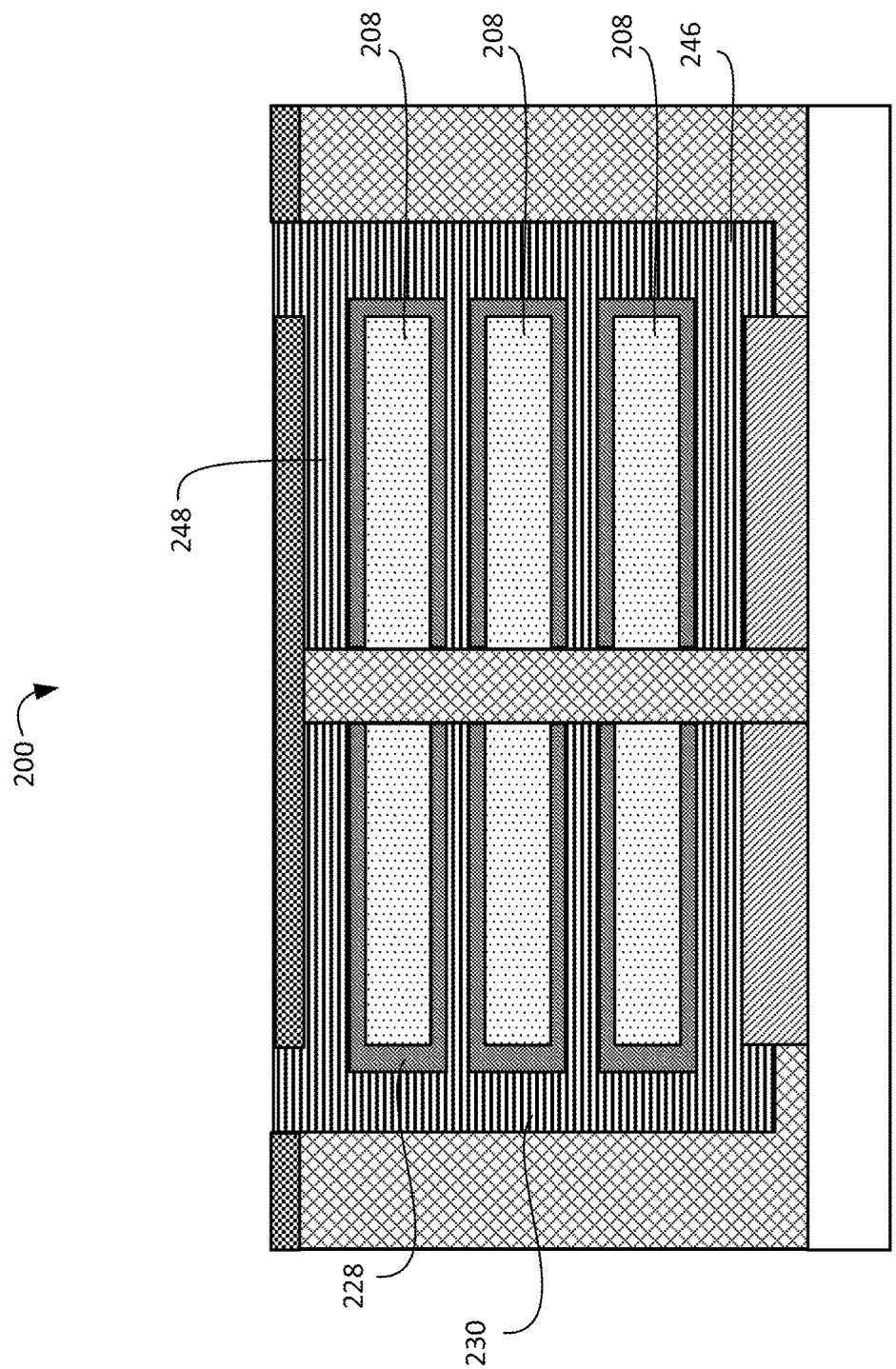
FIG. 8 illustrates a cross sectional view of a semiconductor device during various fabrication stages, made by the method of FIG. 1, in accordance with some embodiments.
Figure 9:
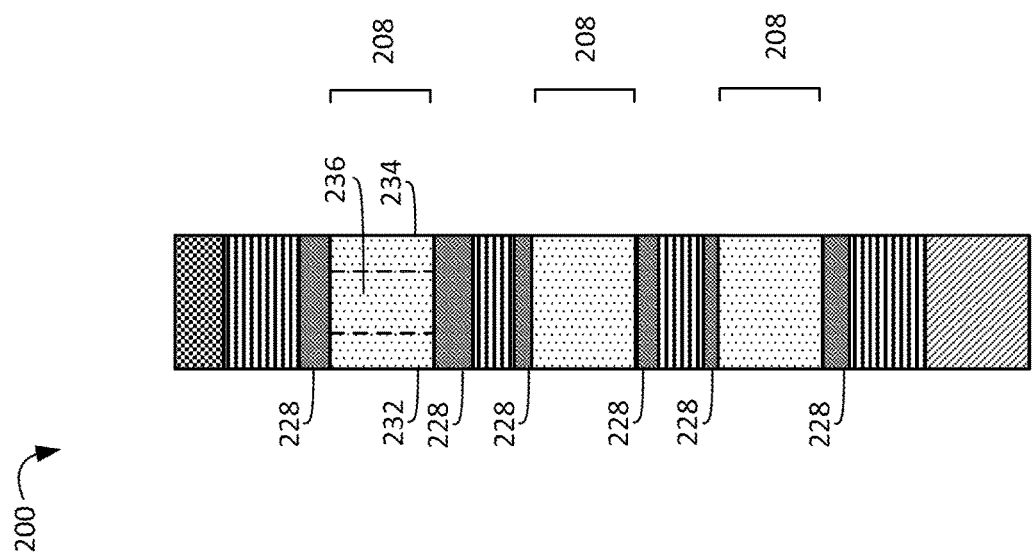
FIG. 9 illustrates a cross sectional view of a semiconductor device during various fabrication stages, made by the method of FIG. 1, in accordance with some embodiments.

Corresponding to operations 114 and 116 of FIG. 1, FIG. 8 is a cross sectional view of the semiconductor device 200 in which a gate structure is formed. FIG. 9 is a cross sectional view of the semiconductor device 200, as viewed perpendicular to the cross sectional view of FIG. 8, in accordance with various embodiments.

At operation 114, a gate dielectric 228 is formed at over at least a portion of the non-sacrificial semiconductor layers (e.g., over the third layers 208). The gate dielectric can be a high-k dielectric. The gate dielectric can be configured to selectively adhere to the semiconductor (e.g., silicon) of the semiconductor device 200. As shown, the gate dielectric 228 can cover a first portion of the at least some portions of the non-sacrificial semiconductor layers. A second portion of the non-sacrificial semiconductor layers may not be covered by the gate dielectric 228. For example, FIG. 9 can depict the right face of the left nanostructure of FIG. 8, along a plane defined by the interface of the body dielectric 222. Each of the third layers 208 can be vertically bounded by the gate dielectric 228, and may interface with the body dielectric 222, such that the portions of the respective layers visible in FIG. 8 or 9 may not interface directly with the gate dielectric 228 (e.g., the transistors described herein may not be a gate-all-around transistor).

At operation 116, a gate electrode 230 is formed over the gate dielectric 228. The gate can be selectively formed over the gate dielectric 228, or can be formed by another process. For example, one or more metal materials (e.g., alloys, coatings, or elements) can be grown along the gate dielectric 228. In some embodiments, the gate electrode 230 is deposited to fill the first openings and the upper surface of the semiconductor device 200 is thereafter planarized. The gate electrode 230 can be a metal gate electrode. For example, the gate electrode can include cobalt, copper, aluminum, silver, gold, tungsten, the like, or alloys or other combinations (e.g., layers) thereof. The gate electrode 230 can fill the first openings 224 or any evacuated portion of the semiconductor device 200 connected thereto. For example, the gate electrode 230 can fill the recesses evacuated by material removed from the second layers 206, such that the gate electrode 230 can encapsulate the gate dielectric 228. The gate electrode can include a plurality of horizontal portions 248 and at least one vertical portion 246 to connect the horizontal portions. As depicted in FIG. 9, at an interface between the nanostructure and the body dielectric 222, the gate electrode 230 can extend to a same lateral dimension as the gate dielectric 228, such that the interface between the gate dielectric 228 and the body dielectric 222 is maintained (e.g., the gate dielectric 228 and the body dielectric 222 may directly interface).

With further reference to FIG. 9, the portions of the third layers 208 can be defined according to a function thereof. The center portion of each of the semiconductor material layers can be defined as a channel region 236. A leftmost portion can be defined as a source region 232, and a rightmost portion can be defined as a drain region 234. In some embodiments, the source regions 232 or drain regions 234 can be involved in similar process operations, such they may be referred to collectively as source/drain regions 232, 234. For example, the operations discussed at operation 118 can be similar or the same for the source drain regions. Although the operations may be similar, the source region 232 and drain region 234 may undergo asymmetric variants of the processes. For example, an etching depth, dopant used, or concentration thereof, and the like, can be performed symmetrically or asymmetrically between the source/drain regions 232, 234. The channel regions 236 may also be referred to as semiconductor channels.

Figure 10:
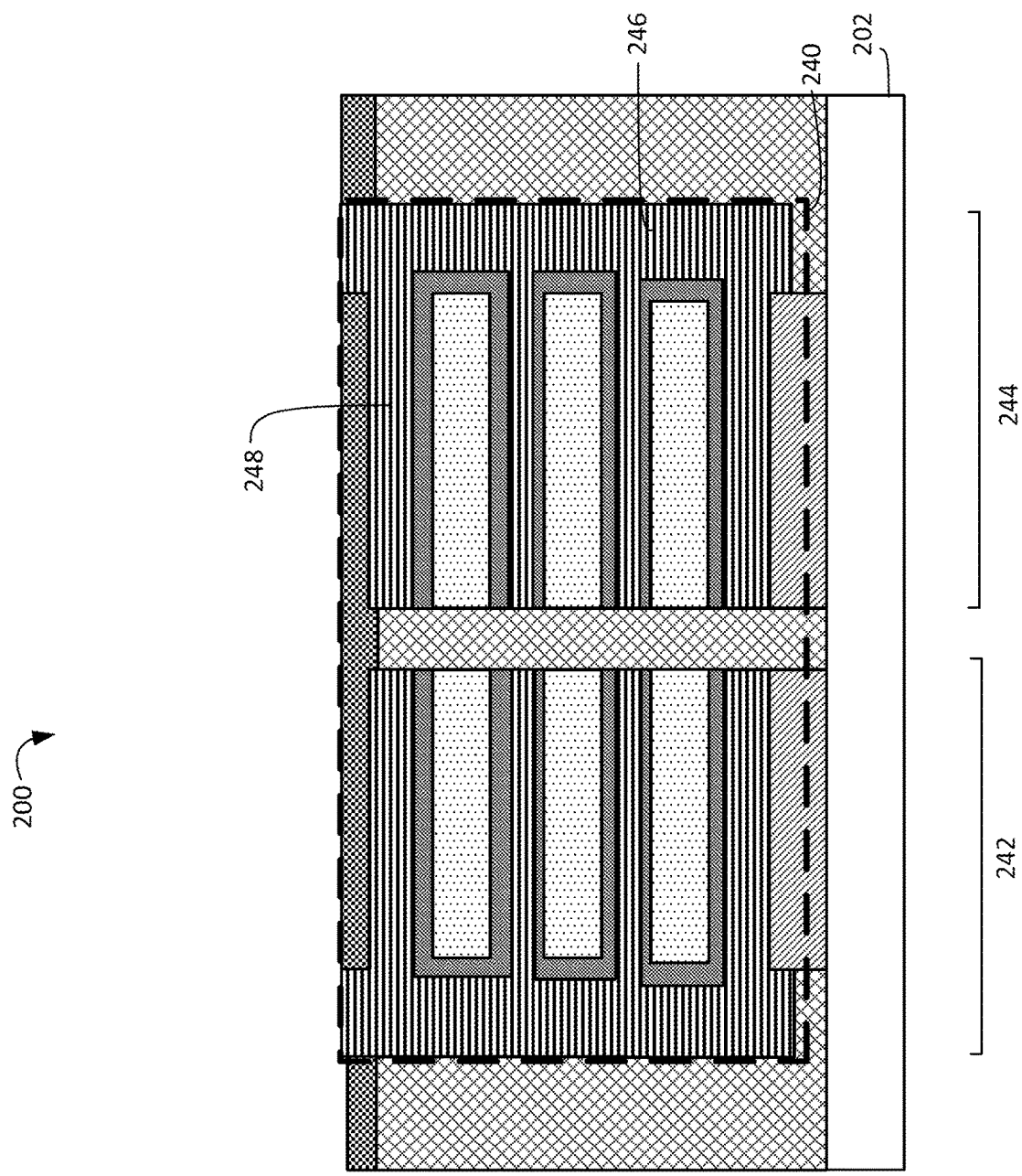
FIG. 10 illustrates a cross sectional view of a semiconductor device during various fabrication stages, made by the method of FIG. 1, in accordance with some embodiments.
Figure 11:
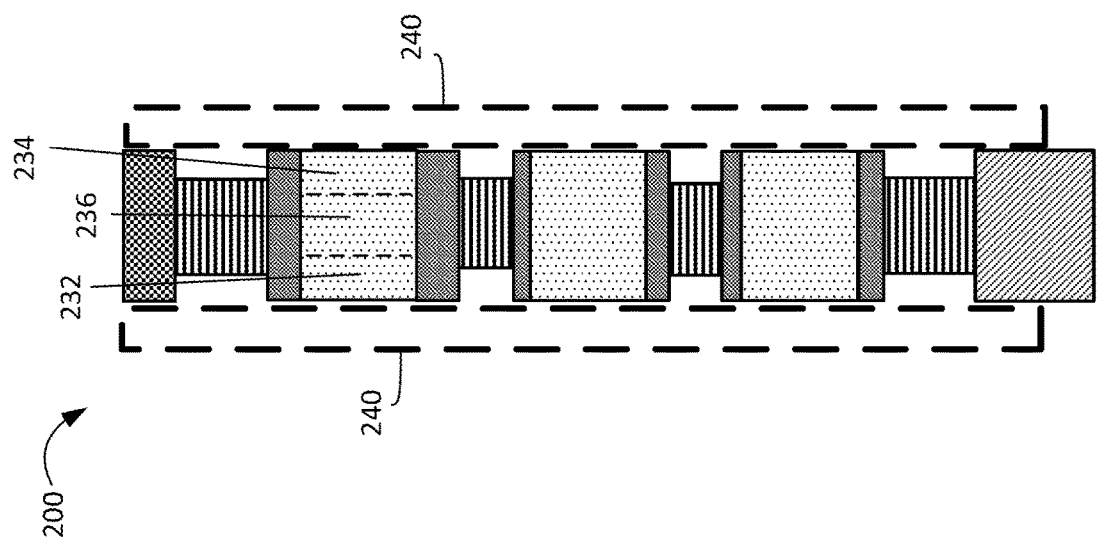
FIG. 11 illustrates a cross sectional view of a semiconductor device during various fabrication stages, made by the method of FIG. 1, in accordance with some embodiments.

Corresponding to operation 118 of FIG. 1, FIG. 10 is a cross sectional view of the semiconductor device 200 in which the gate electrodes 230 are selectively horizontally etched. FIG. 11 is a cross sectional view of the semiconductor device 200, as viewed perpendicular to the cross sectional view of FIG. 10, in accordance with various embodiments.

A shown in FIG. 10, one (as depicted) or more second openings 240 are formed to expose the visible features of the semiconductor device 200. The second openings can extend for all or a portion of the gate electrode 230. For example, the second openings 240 can extend along along a first lateral distance 242 and a second lateral distance 244 of the source/drain regions 232, 234. The second openings 240 can extend from an upper surface of the semiconductor device to the lowermost source/drain regions 232, 234. For example, the second openings can extend to the substrate 202. An etchant can be introduced, through the second openings 240 to recess etch the gate electrode 230 or a portion thereof.

As shown in FIG. 11, each of the third layers 208, of the semiconductor device 200 are recess etched. For example, the etchant can selectively etch one or more portions (e.g., coatings or thicknesses) of the gate electrode 230 (e.g., can be material specific or time or volume controlled to etch a defined lateral distance of the respective layers). The recess etching laterally reduces the dimension of the gate electrode 230. The reduction in lateral dimension can create isolation between the source/drain regions 232, 234 (e.g., source/drain regions 232, 234 laterally defined by the recession of the gate electrode 230) and the channel region 236 of the semiconductor device 200.

Figure 12:
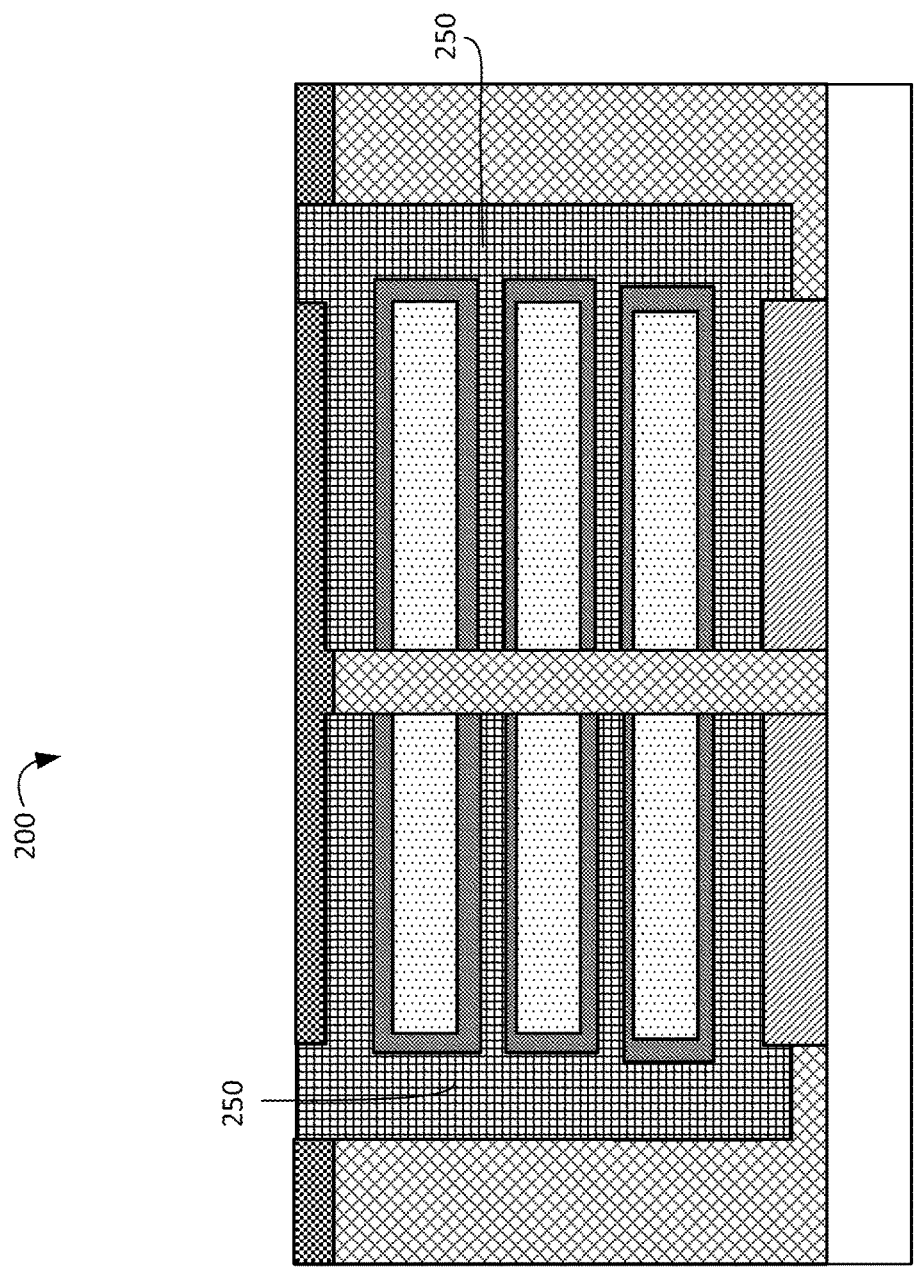
FIG. 12 illustrates a cross sectional view of a semiconductor device during various fabrication stages, made by the method of FIG. 1, in accordance with some embodiments.
Figure 13:
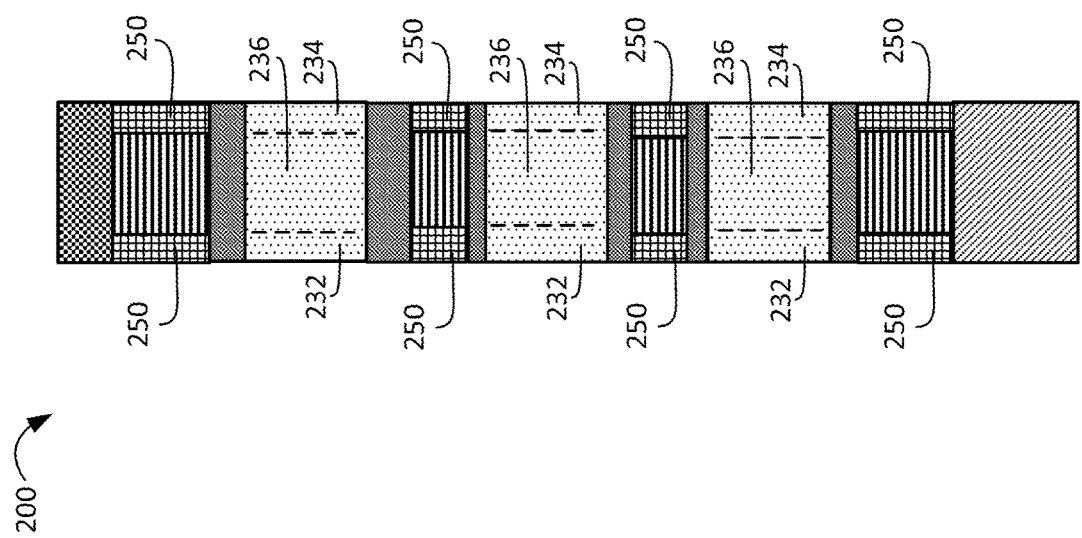
FIG. 13 illustrates a cross sectional view of a semiconductor device during various fabrication stages, made by the method of FIG. 1, in accordance with some embodiments.

Corresponding to operation 120 of FIG. 1, FIG. 12 is a cross sectional view of the semiconductor device 200 in which recessed portions of the gate electrode are replaced with a dielectric. FIG. 13 is a cross sectional view of the semiconductor device 200, as viewed perpendicular to the cross sectional view of FIG. 12, in accordance with various embodiments.

As depicted in FIG. 12, a gate insulating dielectric 250 is formed in the recessed portion of the gate electrode 230. In some embodiments, the gate insulating dielectric 250 can fill the second openings 240. For example, the gate insulating dielectric 250 can be formed according to the process described with references to the body dielectric 222. In some embodiments, the gate insulating dielectric 250 can be a same dielectric as the body dielectric 222. In some embodiments, the gate insulating dielectric 250 can be another dielectric material. For example, the gate insulating dielectric 250 can be selected according to an isolation voltage, an interfacability with adjoining materials (e.g., resistance to diffusion of adjoining materials), or dielectric constant (e.g., may be a low-k dielectric to reduce a capacitance). Although, as depicted in FIG. 12, only the gate insulating dielectric 250 surrounding the source region 232 is visible, the gate insulating dielectric 250 can isolate the drain region 234, with the gate electrode 230 disposed therebetween, as is depicted in FIG. 13.

Figure 14:
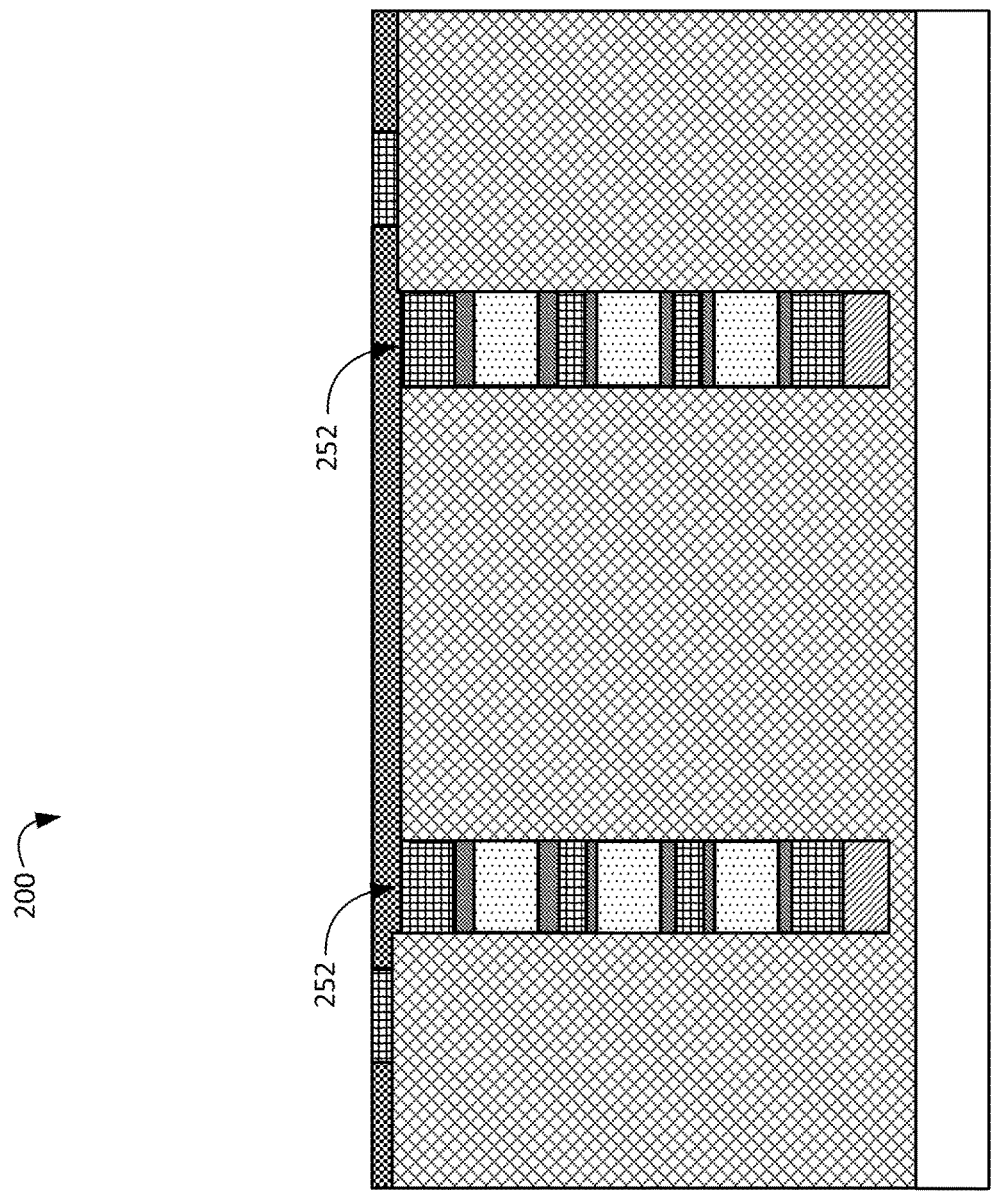
FIG. 14 illustrates a cross sectional view of a semiconductor device during various fabrication stages, made by the method of FIG. 1, in accordance with some embodiments.

Corresponding to operation 122 of FIG. 1, FIG. 14 is a cross sectional view of the semiconductor device 200 in which third openings 252 are formed to expose the source/drain regions 232, 234. As shown in FIG. 14, the third openings 252 can be formed according to the same operations described with respect to the first openings 224 (at operation 108) or the second openings 240 (at operation 118). As discussed with regard to the second openings 240, the third openings 252 can be of various dimensions. For example, the features (e.g., deposited metal or epitaxially gown features) of FIGS. 15, 16, and 17 can each have a different dimension thereof.

Figure 15:
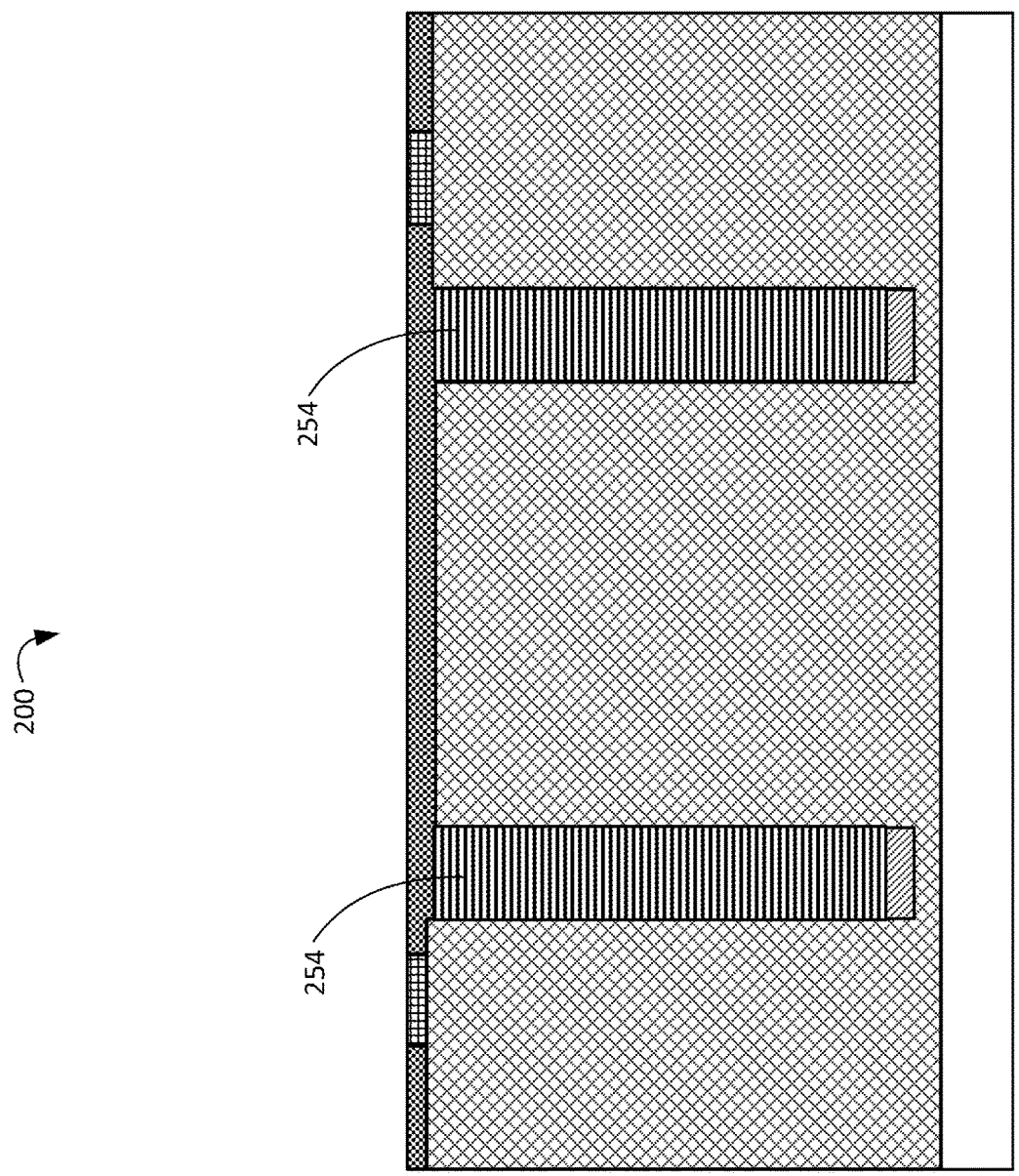
FIG. 15 illustrates a cross sectional view of a semiconductor device during various fabrication stages, made by the method of FIG. 1, in accordance with some embodiments.

Corresponding to operation 124 of FIG. 1, FIG. 15 is a cross sectional view of the semiconductor device 200 in which the source/drain regions 232, 234 are prepared for connection, in accordance with various embodiments. Preparing the source/drain regions 232, 234 for connection can include doping or otherwise treating/activating the source/drain regions 232, 234 for connection to a source or drain electrode, forming or processing the source or drain electrodes for connection to a interconnect structure to interconnect a plurality of transistors, or a formation of another intermediate layer. Various embodiments will be discussed with regard to each of FIGS. 15, 16, and 17. The disclosed examples are not intended to be limiting. Indeed, the source/drain regions 232, 234 can be prepared according to combinations of the methods disclosed herein, and with other methods known in the art. The description of electrodes herein is not exhaustive. For example, although no figure is directed to a formation of a silicide to join the source/drain regions 232, 234 to a source/drain electrode, such an operation is within the scope of the present disclosure.

As depicted in FIG. 15, the source/drain regions 232, 234 can be doped, through the third openings 252. For example, the source/drain regions 232, 234 can be doped by a plasma doping process. In some embodiments, a dopant can be deposited (e.g., selectively deposited) over the source/drain regions 232, 234, and can thereafter dope the source/drain regions 232, 234 by a diffusion process (e.g., according to a time-temperature profile). In some embodiments, a plurality of doping operations or dopants can be employed, such as to create a dopant profile along each of the source region 232, drain region 234, or channel region 236. For example, the channel can be intrinsic silicon or can be doped to a same or different type as the source and drain (e.g., the source, channel, and drain can be doped N-P-N, or P-N-P, respectively). One or more dopants or processes can form a lightly doped region, and another dopant or process can form a more heavily doped region (e.g., of a same or different type).

A metal can be deposited into the third openings 252 to form a source or drain electrode 254. For example, the metal can be deposited and planarized according to an alternating deposition and planarization process. The metal can be the same metal as the gate electrode, can contain one or more of the same metals in an alloy or another combination, or can be a different metal.

Figure 16:
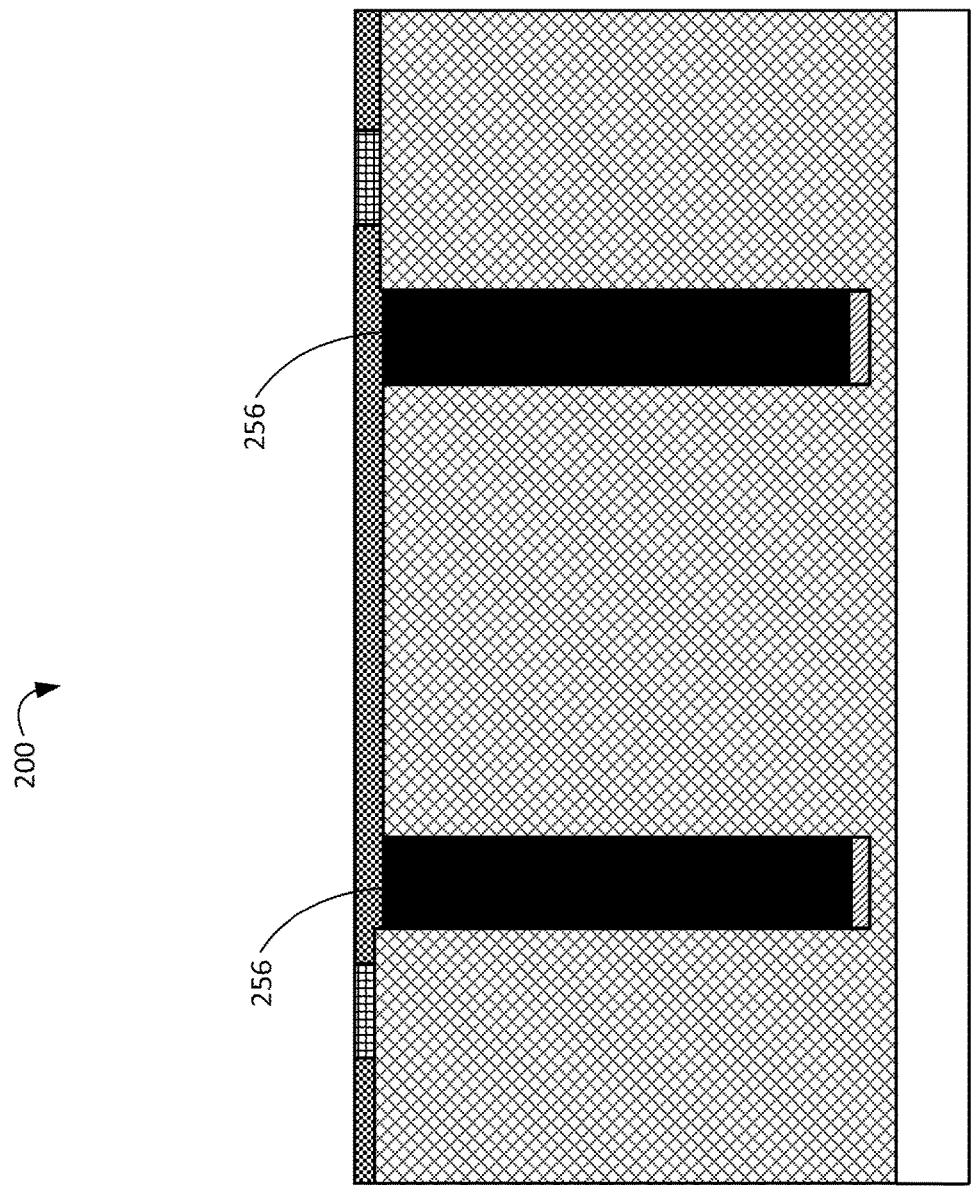
FIG. 16 illustrates a cross sectional view of a semiconductor device during various fabrication stages, made by the method of FIG. 1, in accordance with some embodiments.
Figure 17:
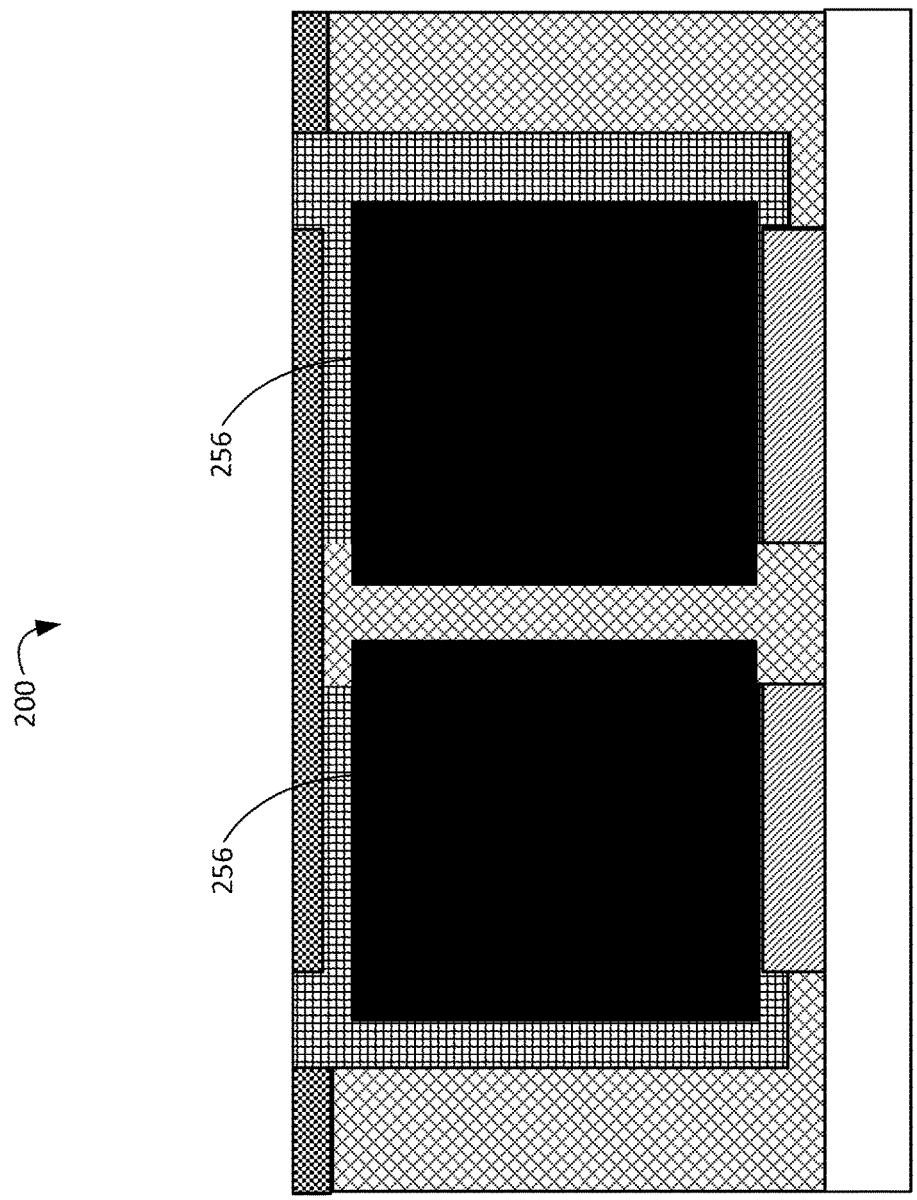
FIG. 17 illustrates a cross sectional view of a semiconductor device during various fabrication stages, made by the method of FIG. 1, in accordance with some embodiments.

With continued reference to operation 124 of FIG. 1, FIG. 16 is another cross sectional view of the semiconductor device 200 in which the source/drain regions 232, 234 are prepared for connection, in accordance with various embodiments. FIG. 17 is another cross sectional view having a different dimension of third openings 252. As shown in FIG. 16, an additional semiconductor material 256 is formed over the portion of source/drain regions 232, 234 exposed by the third openings 252. For example, the source/drain regions 232, 234 can be or include silicon and additional silicon can be epitaxially grown there-over. In some embodiments, the additional semiconductor material 256 can be grown over each of the source/drain regions 232, 234 such that the additional semiconductor material 256 merges to form a contiguous semiconductor region over a plurality of the source/drain regions 232, 234.

The additional semiconductor material 256 can be doped, (e.g., heavily, to electrically connect the source/drain regions to an interconnect structure or additional source or drain electrode 254). For example, a dopant can be introduced during or following the epitaxial growth. The dopant can be a p-type or n-type dopant. The reverse side (not depicted) of the semiconductor device 200 can include a same additional semiconductor material 256 such that the sources and drains of each transistor of the depicted pair of transistors can have common drains and sources. As depicted in FIG. 17, the dimensions of the one or more third openings can be of various dimensions. For example, a larger opening may increase a horizontal dimension of the additional semiconductor material 256, which may reduce a resistance thereof (e.g., to or from electrodes or pads disposed on an upper surface of the semiconductor device 200).

Figure 18:
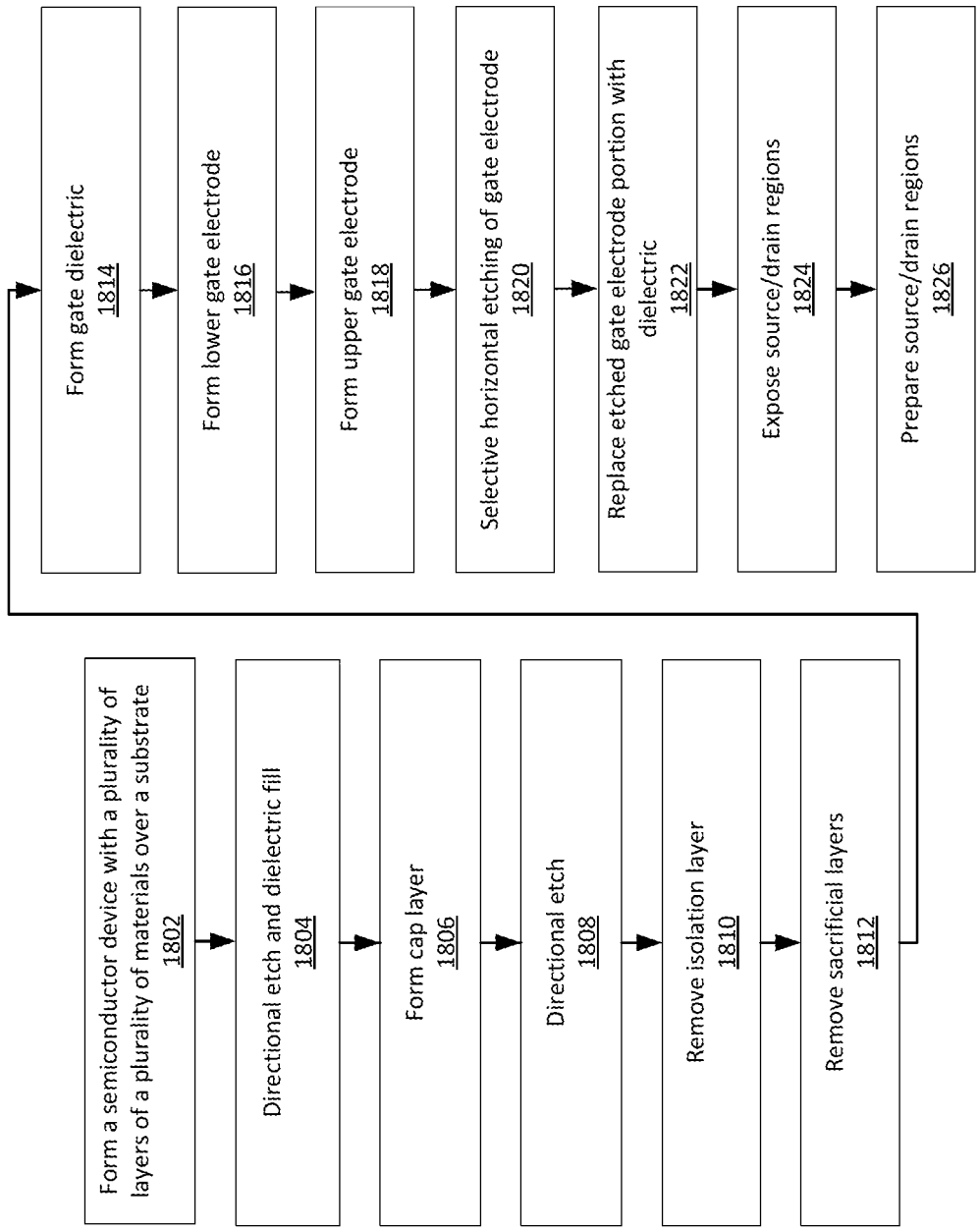
FIG. 18 is a flow chart of a method for making a semiconductor device, in accordance with some embodiments.

FIG. 18 illustrates a flow chart of a method 1800 for making an array of transistors being vertically and laterally spaced. For example, the vertical stack structure can be formed by a plurality of nanosheets to form a semiconductor device 200. The vertical stack structure can include two columns of transistors, without an electrical connection therebetween. In some embodiments, the two columns of transistors can be connected by an additional operation, such as along a surface of the semiconductor device 200. In some embodiments, respective transistors can be disconnected (e.g., can be independently operated in separate circuits). It is noted that the method 1800 is merely an example, and is not intended to limit the present disclosure. Accordingly, it is understood that additional operations may be provided before, during, and after the method 1800 of FIG. 18, and that some other operations may only be briefly described herein.

In various embodiments, operations of the method 1800 may be associated with top views and cross-sectional views of an example semiconductor device 200 at various fabrication stages as shown in FIGS. 19 to 24, which will be discussed in further detail below. It should be understood that the semiconductor device 200, shown in FIGS. 19 to 24, may include a number of other devices such as inductors, fuses, capacitors, coils, etc., while remaining within the scope of the present disclosure.

In brief overview, the method 1800 starts with operation 1802 of forming a semiconductor device comprising a plurality of materials formed over a substrate. The method 1800 continues to operation 1804 of directionally etching a portion of the semiconductor device, and filling the etched portion with a dielectric fill. The method 1800 proceeds to operation 1806 of forming a cap layer over the semiconductor device. The method 1800 proceeds to operation 1808 of directionally etching first openings into the semiconductor device. The method proceeds to operation 1810 of isolating a portion of the semiconductor device from the substrate. The method 1800 proceeds to operation 1812 of removing a sacrificial material. The method 1800 proceeds to operation 1814 of forming a gate dielectric over the semiconductor layers. The method 1800 proceeds to operation 1816 wherein a lower metal gate electrode is formed over the lower gate dielectric. At operation 1818, an upper metal gate electrode is formed over the upper gate dielectric. At operation 1820, the gate electrodes are selectively horizontally etched. At operation 1822, the horizontally etched portion of the gate electrode are replaced with a dialectic. At operation 1824, the source/drain regions are exposed. At operation 1826, the drain source regions are prepared for connection such as by doping or a connection of metal electrodes.

Figure 19:
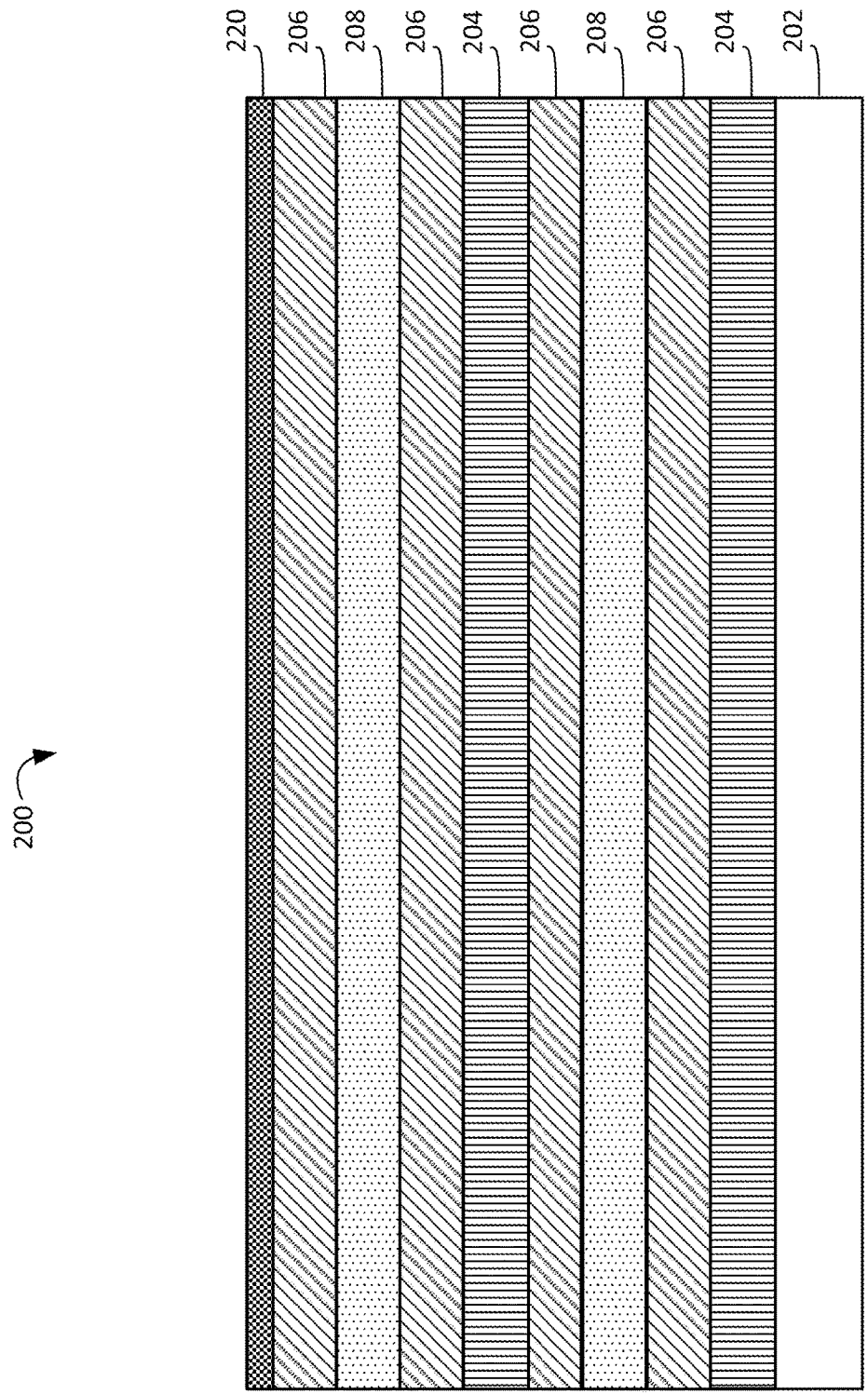
FIG. 19 illustrates a cross sectional view of a semiconductor device during various fabrication stages, made by the method of FIG. 18, in accordance with some embodiments.

Corresponding to operation 1802 of FIG. 1, FIG. 19 is a cross sectional view of a semiconductor device 200 in which a plurality of layers (e.g., blanket layers), including a plurality of materials (e.g., conductive and dielectric materials), are formed over a substrate 202 (e.g., a crystalline silicon, a glass substrate, etc.), in accordance with various embodiments.

As shown in FIG. 19, a plurality of layers (e.g., blanket layers) are formed over the substrate 202. A portion of the plurality of layers may be similar to the layers depicted and described with reference to FIG. 2. Some layers can be substituted, omitted, or added. For example, a further first (isolation) layer 204 of the a plurality of layers can substitute the semiconductor material for a sacrificial material such as the same sacrificial of the first layer 204 of the semiconductor device. For example, a further first layer 204 can segregate a first device (e.g., transistor), located above the layer from a second device located below the layer.

Additional inter-layer materials, can be provided to form a stack having n devices (e.g., transistors) stacked vertically. For example, additional instances of the first layer 204, the second layer 206, the third layer 208, and a further second layer 204 can be included between the upper second layer 206 and the cap layer 220. Each device can include a plurality of source/drain regions 232, 234, such as according to the disclosed method of FIG. 1. For example, each device can include an additional second layer 206 and third layer 208.

Various operations depicted in FIG. 18 may be similar to other operations depicted in this disclosure. For example, in various embodiments, the operations 1804, 1806, 1808, 1810, 1812, 1820, 1822 may be performed in a fashion as has previously been discussed with regard to operations 104, 106, 108, 110, 112, 118, 120 as depicted in FIG. 1. The operations can be adjusted based on the layers formed in operation 1802. For example, at operation 1810, a further first layer 204 can be removed and replaced with the nano-plane material of operation 110.

Figure 20:
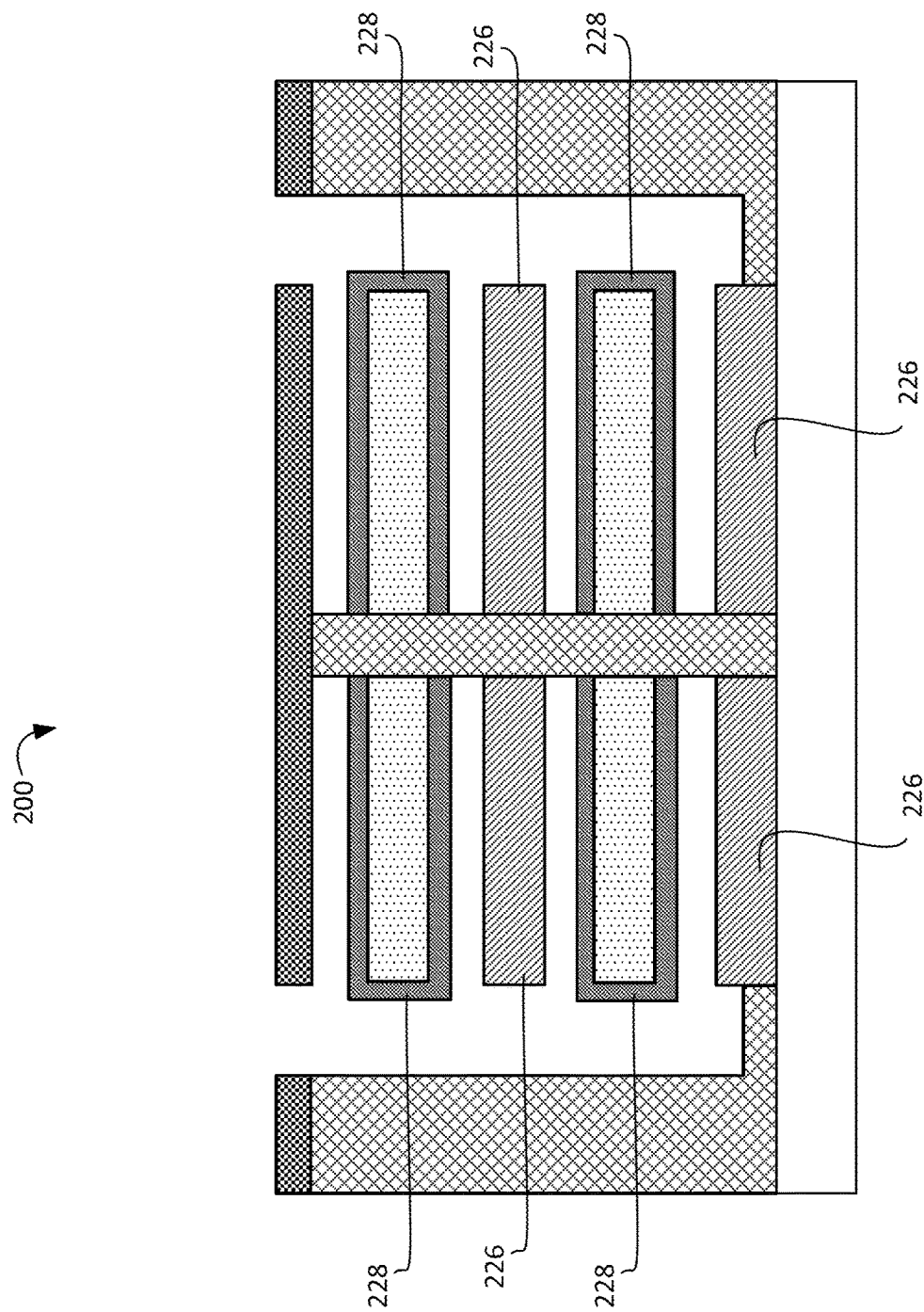
FIG. 20 illustrates a cross sectional view of a semiconductor device during various fabrication stages, made by the method of FIG. 18, in accordance with some embodiments.

Corresponding to operation 1814 of FIG. 18, FIG. 20 is a cross sectional view of the semiconductor device 200 in which a gate dielectric 228 is formed over the semiconductor material, in accordance with various embodiments. The gate dielectric 228 can be formed according to the disclosure provided with regard to operation 114. Prior to the formation of the gate dielectric 228, the semiconductor device 200 of FIG. 21 can appear similar to the semiconductor device of FIG. 7, wherein the central layer is depicted as an isolation material 226 rather than a semiconductor layer. The isolation material 226 of the central layer can be formed similarly to the isolation material 226 of the first layer 204, such as simultaneously, or by a pair of serial operations. As depicted, the gate is not selective to the isolation material 226 of the central layer, and thus, no gate is formed over that portion, and the isolation material 226 can isolate an upper device from a lower device.

Figure 21:
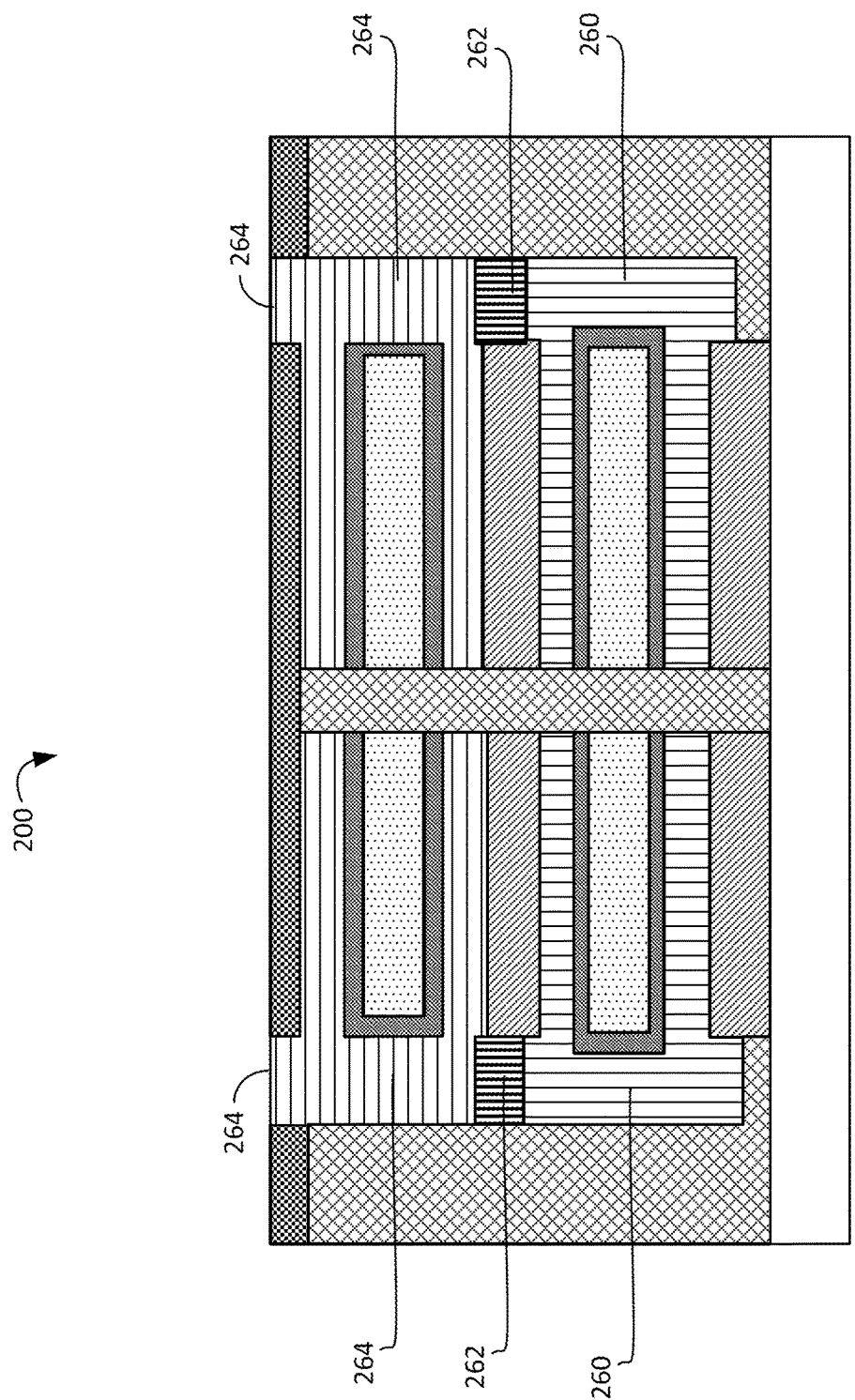
FIG. 21 illustrates a cross sectional view of a semiconductor device during various fabrication stages, made by the method of FIG. 18, in accordance with some embodiments.
Figure 22:
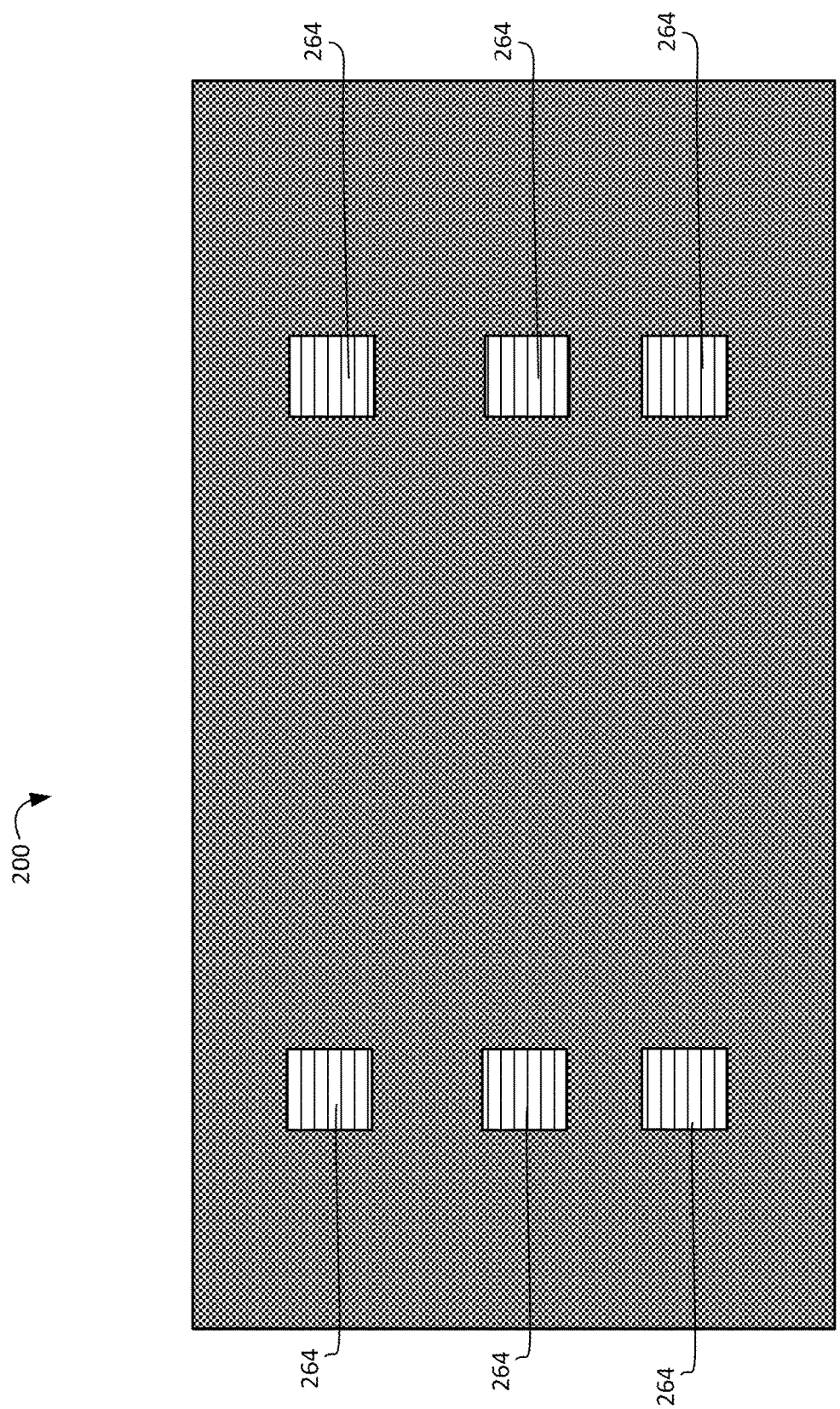
FIG. 22 illustrates a top view of a semiconductor device during various fabrication stages, made by the method of FIG. 18, in accordance with some embodiments.

Corresponding to operations 1816 and 1818 of FIG. 18, FIG. 21 is a cross sectional view of the semiconductor device 200 in which lower and upper gate electrodes are formed over the gate dielectric, in accordance with various embodiments. FIG. 22 is a top view of the semiconductor device depicted in FIG. 21, in accordance with various embodiments.

At operation 1816, the lower gate electrode 260 can be formed by forming a metal gate according to the disclosure of operation 114, discussed with regard to FIG. 8. The gate electrode 230 can thereafter be etched back to an upper surface of the lower gate electrode 260. For example, the gate electrode 230 can be etched back by a same etchant used to horizontally etch the gate electrode 230 at operation 118 or can be a variant thereof, or different etchant. In some embodiments, the material of the lower gate electrode 260 can be selected according to an etchability or selectivity thereof, and may therefor vary from other gate electrodes 230 disclosed herein. A dielectric layer can thereafter be deposited to form a vertical isolation 262 between the respective devices. For example, the vertical isolation 262 can be the gate insulating dielectric 250 or the body dielectric 222. In some embodiments, the vertical isolation 262 can be formed by a selective deposition process (e.g., to selectively deposit over the gate electrode 230 or the isolation material 226). In some embodiments, the vertical isolation 262 can be formed by non-selective deposition process and a subsequent etch back process.

At operation 1818, the upper gate electrode 264 is formed. The upper gate electrode 264 can be formed in a similar manner as the lower gate electrode 260, wherein the electrode is not etched back. In some embodiments, either of the upper gate electrode 264 or the lower gate electrode 260 can be planarized along an upper surface of the semiconductor device, such as according to a CMD/G process.

Referring now to FIG. 22, a planarized upper surface of the semiconductor device 200 is depicted. The upper gate electrodes 264 for each of three instances of the structure pair depicted in FIG. 21 are extend through the cap layer of the cap layer 220 of the semiconductor device 200. The lower electrodes (not depicted) can also be connected through the upper surface. For example, the lower electrodes and upper gate electrodes 264 can include parallel vertical portions 266 of the gate electrode.

Figure 23:
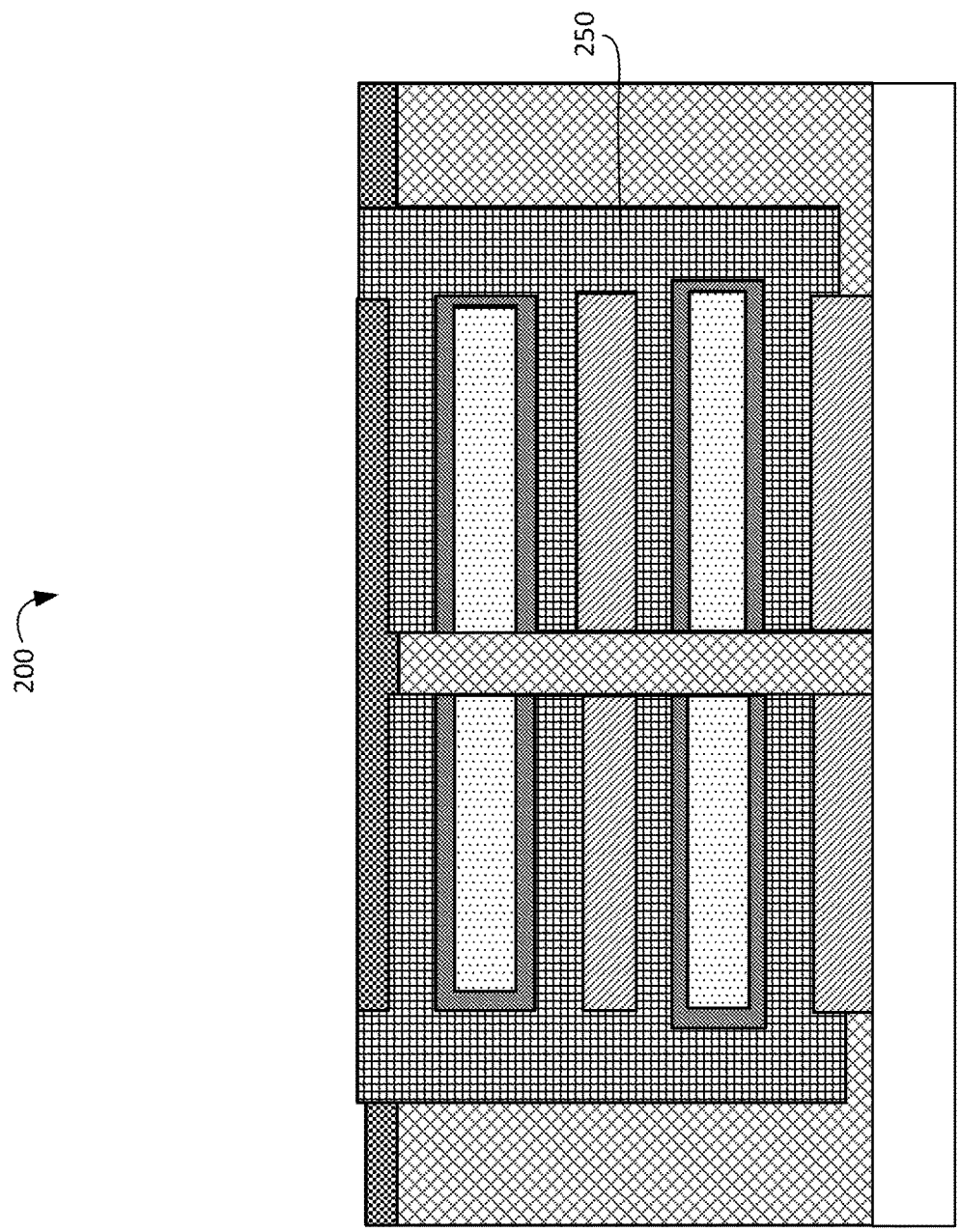
FIG. 23 illustrates a cross sectional view of a semiconductor device during various fabrication stages, made by the method of FIG. 18, in accordance with some embodiments.

Corresponding to operation 1824 of FIG. 18, FIG. 23 is a cross sectional view of the semiconductor device 200 in which the source or drain regions are exposed, in accordance with various embodiments. The exposed portions of the respective devices can expose the source regions 232 or drain regions 234 of the four depicted transistors, which can enable the formation, connection, or interface for source or drain electrode 254.

Figure 24:
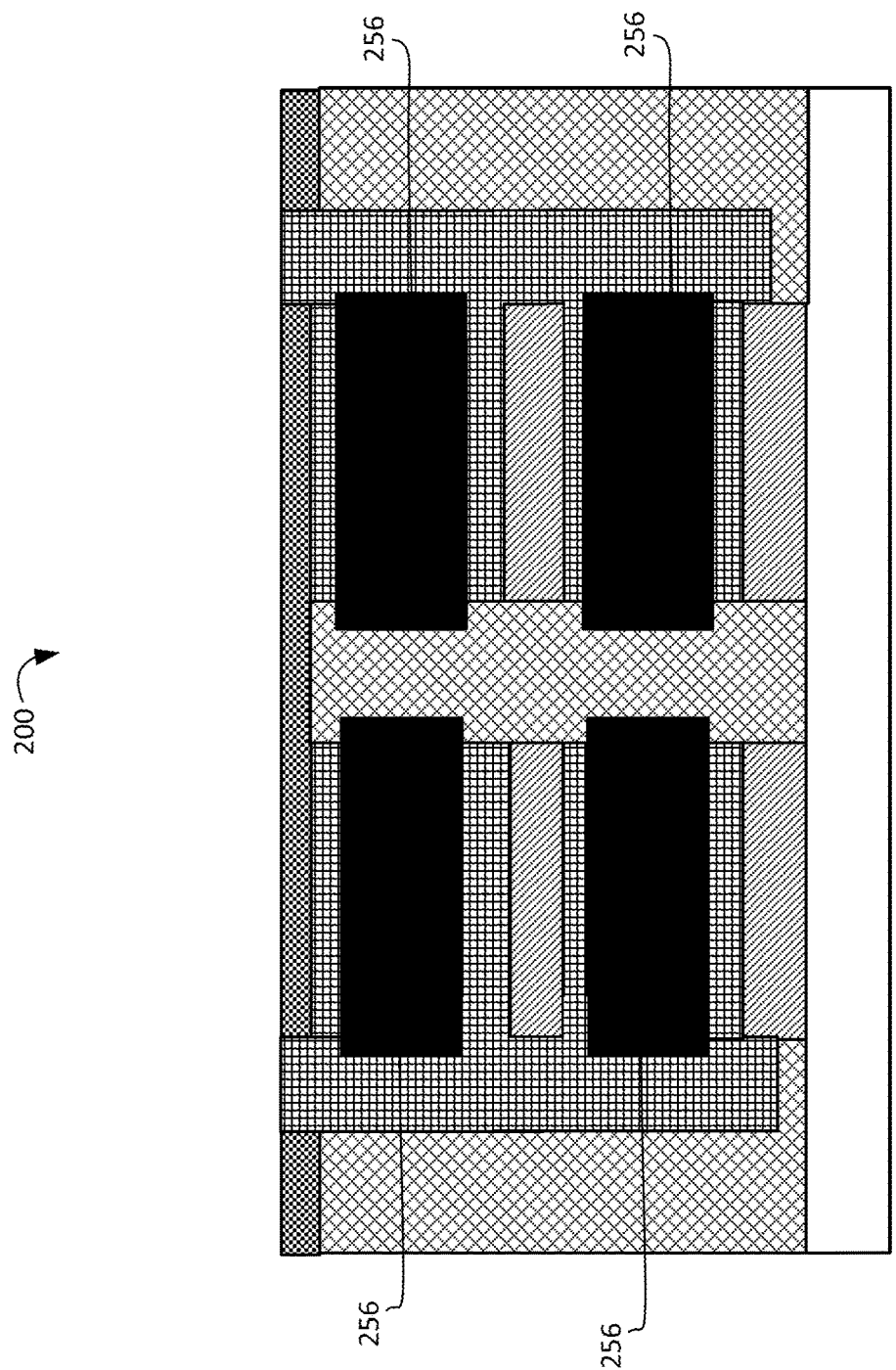
FIG. 24 illustrates a cross sectional view of a semiconductor device during various fabrication stages, made by the method of FIG. 18, in accordance with some embodiments.

Corresponding to operation 1926 of FIG. 18, FIG. 24 is a cross sectional view of the semiconductor device 200 in which the source or drain regions are prepared for connection, in accordance with various embodiments.

In the depicted embodiment, an additional semiconductor material 256, such as a heavily doped n-type semiconductor is connected to each source/drain region 232, 234 of the semiconductor device (e.g., forming four transistors.) The depicted embodiment is not intended to be limiting. Indeed, various devices such as various transistor types can be formed according to the current disclosure, including the various embodiments described at operation 124. Further, as discussed above, additional layers can form additional transistors or additional source/drain regions 232, 234 for one or more of the transistors. The additional semiconductor material 256 can be connected to another conductive element (e.g., a via to a surface of the semiconductor device 200). For example, interconnections from a top (or bottom) surface of the semiconductor device 200 can electrically connect to the lower gate electrode 260 or the various additional semiconductor material 256 portions (e.g., the epitaxial grown regions).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method, comprising:
providing a plurality of first semiconductor channels vertically spaced from one another and a plurality of second semiconductor channels vertically spaced from one another, wherein the plurality of first semiconductor channels each have a first sidewall in contact with a dielectric structure and the plurality of second semiconductor channels each have a first sidewall in contact with the dielectric structure;
forming a first gate structure around at least a top surface, a bottom surface, and a second sidewall of each of the plurality of first semiconductor channels opposite to its respective first sidewall;
concurrently with forming the first gate structure, forming a second gate structure around at least a top surface, a bottom surface, and a second sidewall of each of the plurality of second semiconductor channels opposite to its respective first sidewall; and
doping opposite ends of the plurality of first semiconductor channels and the plurality of second semiconductor channels to form a plurality of activated source/drain regions.

2. The method of claim 1, wherein
forming the first gate structure comprises:
  forming a high-k dielectric over at least the top surface, the bottom surface, and
  the second sidewall of each of the plurality of first semiconductor channels; and
  forming a first gate electrode over the high-k dielectric; and
forming the second gate structure comprises:
  forming the high-k dielectric over at least the top surface, the bottom surface, and
  the second sidewall of each of the plurality of second semiconductor channels; and
  forming a second gate electrode over the high-k dielectric.

3. The method of claim 1, wherein forming the first gate structure or the second gate structure comprises:
  forming a gate dielectric over the first semiconductor channels and the second semiconductor channels;
  forming a gate electrode over the gate dielectric, the gate electrode comprising:
    a plurality of horizontal portions vertically bounding the first semiconductor channels and the second semiconductor channels; and
    a vertical portion connecting the plurality of horizontal portions; and
  horizontally etching at least the horizontal portions of the gate electrode by:
    forming openings to access opposite sidewalls of the horizontal portions of the gate electrode; and
    horizontally etching the opposite sidewalls to define:
      a plurality of first source regions disposed on an opposite side of the first semiconductor channels from a plurality of first drain regions; and
      a plurality of second source regions disposed on an opposite side of the second semiconductor channels from a plurality of second drain regions.

4. The method of claim 3 further comprising:
replacing the horizontally etched portion of the gate electrode with an additional dielectric structure.

5. The method of claim 4 further comprising:
doping the first source regions and first drain regions with an n-type dopant; and
connecting a metal electrode to the first source regions and the first drain regions.

6. The method of claim 1, wherein:
the plurality of first semiconductor channels are provided as vertically bounded by a plurality of first sacrificial layers;
the first sacrificial layers are removed prior to forming the first gate structure;
the plurality of second semiconductor channels are provided as vertically bounded by a plurality of second sacrificial layers; and
the second sacrificial layers are removed prior to forming the second gate structure.

7. The method of claim 6 wherein the first or second sacrificial layers comprise a silicon germanium alloy, and the first semiconductor channels and the second semiconductor channels each comprise an intrinsic semiconductor material.

8. The method of claim 1, further comprising:
etching openings on opposing sides of each of the plurality of first semiconductor channels and the plurality of second semiconductor channels to access the plurality of first semiconductor channels and the plurality of second semiconductor channels; and
forming a doped semiconductor over the opposite ends of the plurality of activated source/drain regions to electrically connect thereto.

9. The method of claim 8, wherein a contiguous doped semiconductor is formed over each opposite end of the plurality of first semiconductor channels which connects to each of the plurality of first semiconductor channels.

10. The method claim 1 wherein the plurality of first semiconductor channels comprise at least three of the first semiconductor channels, and the plurality of second semiconductor channels comprise at least three of the second semiconductor channels.

11. A method, comprising:
providing a first semiconductor channel and a second semiconductor channel vertically spaced from each other at least with a first dielectric segment, and a third semiconductor channel and a fourth semiconductor channel vertically spaced from each other at least with a second dielectric segment, wherein the first semiconductor channel, the second semiconductor channel, and the first dielectric segment each have a first sidewall in contact with a dielectric structure, and the third semiconductor channel, the fourth semiconductor channel, and the second dielectric segment each have a first sidewall in contact with the dielectric structure;
forming a first gate structure around at least a top surface, a bottom surface, and a second sidewall of the first semiconductor channel opposite to its first sidewall;
concurrently with forming the first gate structure, forming a second gate structure around at least a top surface, a bottom surface, and a second sidewall of the third semiconductor channel opposite to its first sidewall;
forming a third gate structure around at least a top surface, a bottom surface, and a second sidewall of the second semiconductor channel opposite to its first sidewall;
concurrently with forming the third gate structure, forming a fourth gate structure around at least a top surface, a bottom surface, and a second sidewall of the fourth semiconductor channel opposite to its first sidewall; and
doping opposite ends of the first semiconductor channel and the second semiconductor channel to form first activated source/drain regions and second activated source/drain regions.

12. The method of claim 11, wherein forming the first gate structure comprises:
forming a gate dielectric over the first semiconductor channel and the second semiconductor channel;
forming a gate electrode over the gate dielectric, the gate electrode comprising:
  a plurality of horizontal portions vertically bounding the first semiconductor channel and the second semiconductor channel; and
  a vertical portion connecting the plurality of horizontal portions; and
horizontally etching at least the horizontal portions of the gate electrode by:
  forming openings to access opposite sidewalls of the horizontal portions of the gate electrode; and
  horizontally etching the opposite sidewalls to define a plurality of source regions disposed on an opposite side of the first and second semiconductor channel from a plurality of drain regions.

13. The method of claim 12, wherein:
the gate dielectric is a high-k dielectric; and
the first semiconductor channel comprises an intrinsic semiconductor material.

14. The method of claim 12, wherein a lateral dimension of the first source regions or the first drain regions is less than the same lateral dimension of the first semiconductor channel.

15. The method of claim 11, further comprising:
etching openings on opposing sides of the first semiconductor channel and the second semiconductor channel to access the first semiconductor channel and the second semiconductor channel; and
forming a doped semiconductor over the opposite ends of each of the first semiconductor channel and the second semiconductor channel to electrically connect thereto.

16. The method of claim 15, wherein a contiguous doped semiconductor formed over each opposite end of the first semiconductor channel and the second semiconductor channel which electrically connects to each of the opposite ends of the first semiconductor channel and the second semiconductor channel.

17. A structure, comprising:
a dielectric structure vertically extending from a substrate;
one or more first semiconductor channels extending away from the dielectric structure along a first lateral direction, with a first sidewall of each of the one or more first semiconductor channels in contact with the dielectric structure;
one or more second semiconductor channels extending away from the dielectric structure along a second lateral direction that is antiparallel to the first lateral direction, with a first sidewall of each of the one or more second semiconductor channels in contact with the dielectric structure;
a first gate structure disposed around a top surface, a bottom surface, and a second sidewall of each of the one or more first semiconductor channels; and
a second gate structure disposed around a top surface, a bottom surface, and a second sidewall of each of the one or more second semiconductor channels,
wherein doped opposite ends of each of the one or more first semiconductor channels along a third lateral direction perpendicular to the first and second lateral direction are a pair of first source/drain structures, and
wherein doped opposite end of each of the one or more second semiconductor channels along the third lateral direction are a pair of second source/drain structures.

18. The structure of claim 17, wherein lateral extremes, along the third lateral direction and a fourth lateral direction that is antiparallel to the third lateral direction, of the first source/drain structures and second source/drain structures:
extend beyond corresponding lateral planes of the first gate structures or the second gate structures;
extend vertically beyond the first and second semiconductor channels; and
comprise an n-type dopant or a p-type dopant.

19. The structure of claim 18, further comprising:
a first isolation material disposed between the substrate and the pair of first source/drain structures; and
an isolation material disposed between the pair of first source/drain structures; and an additional pair of first source/drain structures, vertically offset from the pair of first source/drain structures.

20. The structure of claim 17, wherein the first or second gate structures comprise:
a high-k dielectric disposed over the first semiconductor channels and the second semiconductor channels;
a gate electrode disposed over the high-k dielectric, the gate electrode comprising:
a plurality of horizontal portions vertically bounding the first semiconductor channels and the second semiconductor channels; and
a vertical portion connecting the plurality of horizontal portions; wherein
at least the vertical portion of the high-k dielectric extends beyond lateral extremes of the gate electrode in the third lateral direction, and in a fourth lateral direction, opposite the third lateral direction.

* * * * *